United States Patent
Kim et al.

(10) Patent No.: US 12,198,994 B2
(45) Date of Patent: Jan. 14, 2025

(54) PACKAGING SUBSTRATE AND METHOD FOR MANUFACTURING SAME

(71) Applicant: ABSOLICS INC., Covington, GA (US)

(72) Inventors: Sungjin Kim, Suwanee, GA (US); Youngho Rho, Daejeon (KR); Jincheol Kim, Hwaseong-si (KR); Byungkyu Jang, Suwon-si (KR)

(73) Assignee: Absolics Inc., Covington, GA (US)

( * ) Notice: Subject to any disclaimer, the term of this patent is extended or adjusted under 35 U.S.C. 154(b) by 527 days.

(21) Appl. No.: 17/434,906

(22) PCT Filed: Mar. 12, 2020

(86) PCT No.: PCT/KR2020/003483
§ 371 (c)(1),
(2) Date: Aug. 30, 2021

(87) PCT Pub. No.: WO2020/185023
PCT Pub. Date: Sep. 17, 2020

(65) Prior Publication Data
US 2022/0059421 A1 Feb. 24, 2022

Related U.S. Application Data

(60) Provisional application No. 62/825,966, filed on Mar. 29, 2019, provisional application No. 62/825,945, (Continued)

(51) Int. Cl.
*H01L 23/15* (2006.01)
*H01L 21/48* (2006.01)
*H01L 23/498* (2006.01)

(52) U.S. Cl.
CPC .......... *H01L 23/15* (2013.01); *H01L 21/4857* (2013.01); *H01L 21/486* (2013.01); *H01L 23/49822* (2013.01)

(58) Field of Classification Search
CPC .............. H01L 21/4857; H01L 21/486; H01L 23/49827; H01L 23/528
See application file for complete search history.

(56) References Cited

U.S. PATENT DOCUMENTS

| 4,835,598 A | 5/1989 | Higuchi et al. |
| 5,304,743 A | 4/1994 | Sen et al. |
| (Continued) | | |

FOREIGN PATENT DOCUMENTS

| CN | 1317163 A | 10/2001 |
| CN | 1614464 A | 5/2005 |
| (Continued) | | |

OTHER PUBLICATIONS

U.S. Appl. No. 17/433,342, filed Aug. 24, 2021, Kim et al., ABSOLICS INC.

(Continued)

*Primary Examiner* — Samuel A Gebremariam
(74) *Attorney, Agent, or Firm* — NSIP Law

(57) ABSTRACT

An embodiment relates to a packaging substrate and a semiconductor device, the semiconductor device comprising: an element unit including a semiconductor element; and a packaging substrate electrically connected to the element unit, wherein a glass substrate is used as the core of the packaging substrate so as to achieve a closer connection between the semiconductor element and a motherboard, thereby allowing an electrical signal to be transmitted over as short a distance as possible. Accordingly, provided is a packaging substrate which can significantly improve electrical characteristics such as signal transmission speed, can substantially prevent the occurrence of a parasitic element and thus more simplify the insulation layer treatment process, and can be applied to a high-speed circuit.

9 Claims, 13 Drawing Sheets

Related U.S. Application Data filed on Mar. 29, 2019, provisional application No. 62/816,972, filed on Mar. 12, 2019, provisional application No. 62/816,984, filed on Mar. 12, 2019.

(56) References Cited

U.S. PATENT DOCUMENTS

| | | |
|---|---|---|
| 5,414,222 A | 5/1995 | Sen et al. |
| 6,610,934 B2 | 8/2003 | Yamaguchi et al. |
| 8,774,580 B2 | 7/2014 | Bolle |
| 9,167,694 B2 | 10/2015 | Sundaram et al. |
| 9,263,370 B2 | 2/2016 | Shenoy et al. |
| 9,420,708 B2 | 8/2016 | Hibino et al. |
| 9,768,090 B2 | 9/2017 | Liang et al. |
| 10,483,210 B2 | 11/2019 | Gross et al. |
| 2002/0093120 A1 | 7/2002 | Magni et al. |
| 2002/0180015 A1 | 12/2002 | Yamaguchi et al. |
| 2005/0214479 A1 | 9/2005 | Erben et al. |
| 2006/0179341 A1 | 8/2006 | Harrod |
| 2006/0182556 A1 | 8/2006 | Liu et al. |
| 2006/0202322 A1 | 9/2006 | Kariya et al. |
| 2006/0226094 A1 | 10/2006 | Cho et al. |
| 2008/0017407 A1 | 1/2008 | Kawano |
| 2008/0217761 A1 | 9/2008 | Yang et al. |
| 2009/0117336 A1 | 5/2009 | Usui et al. |
| 2010/0224524 A1 | 9/2010 | Yuasa et al. |
| 2012/0106117 A1 | 5/2012 | Sundaram et al. |
| 2012/0153463 A1 | 6/2012 | Maeda |
| 2012/0186866 A1 | 7/2012 | Mikado et al. |
| 2013/0050227 A1 | 2/2013 | Petersen et al. |
| 2013/0069251 A1 | 3/2013 | Kunimoto et al. |
| 2013/0293482 A1 | 11/2013 | Burns et al. |
| 2014/0034374 A1* | 2/2014 | Cornejo .......... C03C 21/002 174/264 |
| 2014/0085847 A1 | 3/2014 | Takizawa |
| 2014/0116763 A1 | 5/2014 | Sato et al. |
| 2014/0116767 A1 | 5/2014 | Sato et al. |
| 2014/0326686 A1 | 11/2014 | Li et al. |
| 2015/0027757 A1 | 1/2015 | Shin et al. |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0245486 A1 | 8/2015 | Shin et al. |
| 2016/0111380 A1* | 4/2016 | Sundaram ......... H01L 23/49822 438/126 |
| 2016/0286660 A1 | 9/2016 | Gambino et al. |
| 2016/0300740 A1 | 10/2016 | Xu |
| 2016/0351545 A1 | 12/2016 | Hong et al. |
| 2017/0040265 A1 | 2/2017 | Park et al. |
| 2017/0064835 A1 | 3/2017 | Ishihara et al. |
| 2017/0144844 A1 | 5/2017 | Dong |
| 2017/0154860 A1 | 6/2017 | Hareyama |
| 2017/0179013 A1 | 6/2017 | Kunimoto |
| 2017/0186710 A1* | 6/2017 | Yoon .......... H01L 23/49827 |
| 2017/0223825 A1 | 8/2017 | Thadesar et al. |
| 2017/0363580 A1 | 12/2017 | Ahmad et al. |
| 2018/0068868 A1 | 3/2018 | Jaramillo et al. |
| 2018/0139844 A1 | 5/2018 | You |
| 2018/0226351 A1 | 8/2018 | Park et al. |
| 2018/0240778 A1 | 8/2018 | Liu et al. |
| 2018/0342450 A1 | 11/2018 | Huang et al. |
| 2018/0342451 A1 | 11/2018 | Dahlberg et al. |
| 2019/0269013 A1 | 8/2019 | Takagi et al. |
| 2023/0062692 A1 | 3/2023 | Park |

FOREIGN PATENT DOCUMENTS

| | | |
|---|---|---|
| CN | 1938342 A | 3/2007 |
| CN | 101039549 A | 9/2007 |
| CN | 101189921 A | 5/2008 |
| CN | 101371355 A | 2/2009 |
| CN | 101415626 A | 4/2009 |
| CN | 102097330 A | 6/2011 |
| CN | 102106198 A | 6/2011 |
| CN | 102122691 A | 7/2011 |
| CN | 102246299 A | 11/2011 |
| CN | 102844857 A | 12/2012 |
| CN | 103188866 A | 7/2013 |
| CN | 103208480 A | 7/2013 |
| CN | 106029286 A | 10/2016 |
| CN | 106449574 A | 2/2017 |
| CN | 107112297 A | 8/2017 |
| CN | 107683524 A | 2/2018 |
| CN | 107758041 A | 3/2018 |
| CN | 107848878 A | 3/2018 |
| CN | 108878343 A | 11/2018 |
| CN | 109411432 A | 3/2019 |
| EP | 0 526 456 B1 | 8/1998 |
| EP | 1732937 A1 | 12/2006 |
| EP | 1 988 758 A1 | 11/2008 |
| EP | 3 083 125 B1 | 10/2016 |
| JP | 2000-142876 A | 5/2000 |
| JP | 2001-7531 A | 1/2001 |
| JP | 3173250 B2 | 6/2001 |
| JP | 2004-311919 A | 11/2004 |
| JP | 2004-349472 A | 12/2004 |
| JP | 2005-235497 A | 9/2005 |
| JP | 2007-80720 A | 3/2007 |
| JP | 2007-227967 A | 9/2007 |
| JP | 2007-281251 A | 10/2007 |
| JP | 2007-281252 A | 10/2007 |
| JP | 3998984 B2 | 10/2007 |
| JP | 2007-291396 A | 11/2007 |
| JP | 2007-530682 A | 11/2007 |
| JP | 4012375 B2 | 11/2007 |
| JP | 2009-295862 A | 12/2009 |
| JP | 2010-80679 A | 4/2010 |
| JP | 2011-228495 A | 11/2011 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2014-236029 A | 12/2014 |
| JP | 2015-18675 A | 1/2015 |
| JP | 2015-70189 A | 4/2015 |
| JP | 2015-80800 A | 4/2015 |
| JP | 2015-95590 A | 5/2015 |
| JP | 2015-103586 A | 6/2015 |
| JP | 2016-18831 A | 2/2016 |
| JP | 2016-34030 A | 3/2016 |
| JP | 2016-111221 A | 6/2016 |
| JP | 2016-136615 A | 7/2016 |
| JP | 2016-213253 A | 12/2016 |
| JP | 2016-213466 A | 12/2016 |
| JP | 2016-225620 A | 12/2016 |
| JP | 2017-5174 A | 1/2017 |
| JP | 2017-41645 A | 2/2017 |
| JP | 2017-50315 A | 3/2017 |
| JP | 2017-510531 A | 4/2017 |
| JP | 6110437 B2 | 4/2017 |
| JP | 2017-112209 A | 6/2017 |
| JP | 2017-121648 A | 7/2017 |
| JP | 2018-120902 A | 8/2017 |
| JP | 2017-216398 A | 12/2017 |
| JP | 6273873 B2 | 2/2018 |
| JP | 2018-107256 A | 7/2018 |
| JP | 2018-107423 A | 7/2018 |
| JP | 2018-116951 A | 7/2018 |
| JP | 2018-148086 A | 9/2018 |
| JP | 2018-160697 A | 10/2018 |
| JP | 2018-163901 A | 10/2018 |
| JP | 2018-163986 A | 10/2018 |
| JP | 2018-174189 A | 11/2018 |
| JP | 2018-174190 A | 11/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |
| KR | 10-0447323 B1 | 9/2004 |

(56) References Cited

FOREIGN PATENT DOCUMENTS

| | | |
|---|---|---|
| KR | 10-0538733 B1 | 12/2005 |
| KR | 10-2006-0111449 A | 10/2006 |
| KR | 10-2006-0134133 A | 12/2006 |
| KR | 10-0687557 B1 | 2/2007 |
| KR | 10-0720090 B1 | 5/2007 |
| KR | 10-2007-0076737 A | 7/2007 |
| KR | 10-2007-0085553 A | 8/2007 |
| KR | 10-0794961 B1 | 1/2008 |
| KR | 10-2008-0047127 A | 5/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0027159 A | 3/2013 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0003050 A | 1/2019 |
| KR | 10-2019-0008103 A | 1/2019 |
| KR | 10-1944718 B1 | 2/2019 |
| KR | 10-2019-0026676 A | 3/2019 |
| TW | 200609240 A | 3/2006 |
| TW | 201929100 A | 7/2019 |
| WO | WO 2004/053983 A1 | 6/2004 |
| WO | WO 2005/097843 A1 | 10/2005 |
| WO | WO 2006/050205 A2 | 5/2006 |
| WO | WO 2008/013054 A1 | 1/2008 |
| WO | WO 2008/105496 A1 | 9/2008 |
| WO | WO 2009/005492 A1 | 1/2009 |
| WO | WO 2012/061304 A1 | 5/2012 |
| WO | WO 2015/198912 A1 | 12/2015 |
| WO | WO 2016/052221 A1 | 4/2016 |
| WO | WO 2017/057645 A1 | 4/2017 |
| WO | WO 2017/188281 A1 | 11/2017 |
| WO | WO 2018/101468 A1 | 6/2018 |

OTHER PUBLICATIONS

U.S. Appl. No. 17/433,338, filed Aug. 24, 2021, Kim et al., ABSOLICS INC.

U.S. Appl. No. 17/433,349, filed Aug. 24, 2021, Kim et al., ABSOLICS INC.

* cited by examiner (a)

(b)

(a)

(b)

PACKAGING SUBSTRATE AND METHOD FOR MANUFACTURING SAME

CROSS-REFERENCE TO RELATED APPLICATION

This application is a U.S. National Stage Application of International Application No. PCT/KR2020/003483, filed on Mar. 12, 2020, which claims priority to U.S. Provisional Patent Application No. 62/816,984, filed on Mar. 12, 2019, U.S. Provisional Patent Application No. 62/816,972, filed on Mar. 12, 2019, U.S. Provisional Patent Application No. 62/825,966, filed on Mar. 29, 2019, and U.S. Provisional Patent Application No. 62/825,945, filed on Mar. 29, 2019, and all the benefits accruing therefrom under the priority, the content of which in their entireties are herein incorporated by reference.

FIELD

The embodiments relate to packaging substrate, and method for manufacturing same.

RELATED ART

In the manufacturing of electronic components, the implementation of a circuit on a semiconductor wafer is referred to as a Front-End Process (FE), and the assembly of a wafer such that it can be actually used in a product is referred to as a Back-End Process (BE). A packaging process is included in the Back-End process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but technology of packaging it completely is not supported yet. Thus, the electrical performance of semiconductors may be determined by the packaging technology and the resulting electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of wirings.

Recently, research is being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

As related art documents, there are
Korean Patent Publication No. 10-2019-0008103,
Korean Patent Publication No. 10-2016-0114710,
Korean Patent No. 10-1468680, and the like.

DISCLOSURE

Technical Problem

The objective of the embodiment is to provide a more integrated packaging substrate and a semiconductor apparatus comprising same, by applying a glass substrate.

The objective of the embodiment is to provide a packaging substrate and a method of manufacturing same, wherein the packaging substrate comprises a glass substrate comprising core seed layer at inside a core via.

TECHNICAL SOLUTION

To solve the above objective, a packaging substrate according to the embodiment includes a core layer and an upper layer,
wherein the core layer includes a glass substrate and a core via,
the glass substrate with a first surface and a second surface facing each other, and a plenty of core vias are disposed with penetrating through the first surface and the second surface; and
the core layer includes the glass substrate and a core distribution layer, and
the core distribution layer includes an electrically conductive layer respectively disposed on at least a part of the first surface and the second surface, and an electrically conductive layer which electrically connects them to each other through the core via;
wherein the core via has an angle of 8 degrees or less of an inner surface observed in a cross section of the core via into a thickness direction based on perpendicular to the first face, wherein the inner surface is a surface from an opening part having a larger diameter between an opening part in contact with the first surface and an opening part in contact with the second surface, to a minimum inner diameter part.

In a general aspect, the core via includes a first opening part in contact with the first surface; a second opening part in contact with the second surface; and a minimum inner diameter part having the smallest inner diameter in the entire core via connecting the first opening part and the second opening part.

In a general aspect, the core via may have a narrowing area in at least a part of the via, a size of the minimum inner diameter part may be 50 to 99%, based on larger one between the diameter of the first surface opening part and the diameter of the second surface opening part.

In a general aspect, when a total length of the core via is designated as 100%, a minimum inner diameter part may be positioned at a spot corresponding to 40 to 60%.

In a general aspect, an angle Ca1 of an inner diameter surface from the minimum inner diameter part to the first opening part and an angle Ca2 of an inner diameter surface from the minimum inner diameter part to the second opening part may be a ratio of 1:0.7 to 1.3.

To solve the above objective, a substrate for semiconductor packaging according to an embodiment includes i) a glass substrate including a first surface and a second surface facing each other, ii) a plurality of core vias passing through the glass substrate in a thickness direction, and iii) a core layer having a core seed layer as a seed for forming an electrically conductive layer on a surface of the core vias,
wherein a ratio (thickness ratio) of a first thickness and a second thickness those are thicknesses of the core seed layer measured at two positions facing each other at the inner diameter surface of the core via may be 1:0.4 to 4.5.

In a general aspect, a thickness distribution rate according to equation 1 of the core seed layer may be 90% or less.

a thickness distribution rate={(a max thickness of the core seed layer–a min thickness of the core seed layer)/an average thickness of the core seed layer}*100%                    [equation 1]

In a general aspect, an average thickness of the core seed layer may be 30 to 200 nm.

To solve the above objective, a method of manufacturing a substrate for a semiconductor packaging according to an embodiment, includes a preparation operation of preparing a pre-treatment substrate including a glass substrate comprising a first surface and a second surface facing each other and a plurality of core vias passing through the glass substrate in a thickness direction; and a sputter operation of forming a core seed layer on the inner diameter surface of the core via by sputtering at an angle of 10 to 35 degree with respect to a reference line perpendicular to the first surface.

To solve the above objective, a semiconductor apparatus includes element unit includes a semiconductor element, and a packaging substrate according to an embodiment in connecting with the element unit.

Effects

Packaging substrate and semiconductor apparatus comprising same of the embodiment can significantly improve electrical properties such as a signal transmission rate by connecting the semiconductor element and a motherboard to be closer to each other so that electrical signals are transmitted through as short a path as possible.

Also, since a glass substrate applied as a core of substrate is an insulator itself, there is a lower possibility of generating parasitic element compared to a conventional silicon core, and thus it is possible to simplify a process of treatment for an insulating layer and it is also applicable to a high-speed circuit.

In addition, unlike silicon being manufactured in the form of a round wafer shape, the glass substrate is manufactured in the form of a large panel, and thus mass production is relatively easy and economic efficiency can be further improved.

DETAILED DESCRIPTION OF EXEMPLARY EMBODIMENTS

Figure 1:
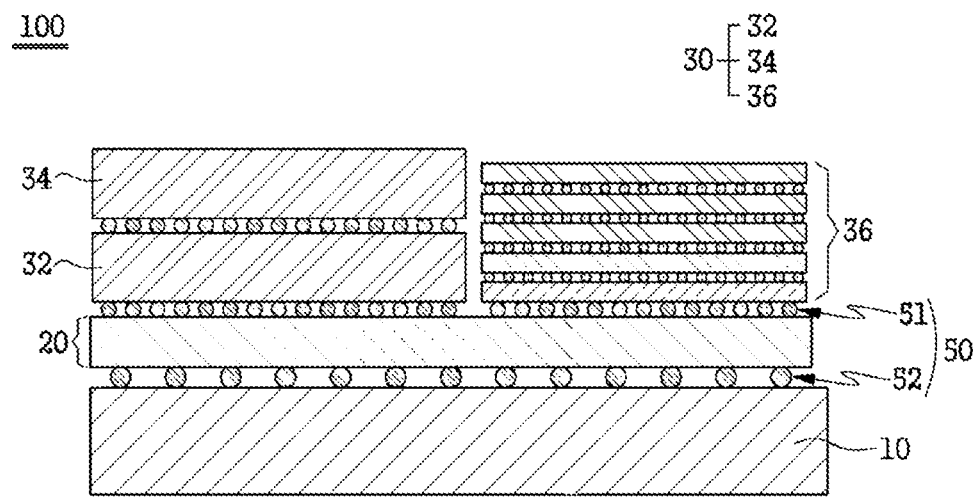
FIG. 1 is a conceptual view for illustrating a cross section of a semiconductor apparatus according to one embodiment.

Hereinafter, examples will be described in detail with reference to the accompanying drawings so that they can be easily practiced by those skilled in the art to which the embodiment pertains. However, the embodiment may be embodied in many different forms and is not to be construed as being limited to the embodiments set forth herein. Like reference numerals designate like elements throughout the specification.

Throughout the present specification, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout the present specification, terms such as "first," "second," "A," or "B" are used to distinguish the same terms from each other. The singular forms "a," "an," and "the" include the plural form unless the context clearly dictates otherwise.

Throughout the present specification, the term "X-based" may mean that a compound includes a compound corresponding to X, or a derivative of X.

Throughout the present specification, "B being disposed on A" means that B is disposed in direct contact with A or disposed over A with another layer or structure interposed therebetween and thus should not be interpreted as being limited to B being disposed in direct contact with A.

Throughout the present specification, "B being connected to A" means that B is connected to A directly or through another element therebetween, and thus should not be interpreted as being limited to B being directly connected to A, unless otherwise noted.

Throughout the present specification, a singular form is contextually interpreted as including a plural form as well as a singular form unless specially stated otherwise.

The inventors have recognized that, in the process of developing a semiconductor apparatus capable of exhibiting high performance with a more integrated and thinner thickness, not only the device itself but also the packaging process is an important factor for improving its performance. And while researching this, inventors have confirmed that, by applying a glass core in a single layer and controlling the shape of a through-via, an electrically conductive layer formed thereon, etc., it is possible to make a packaging substrate thinner and to improve the electrical properties of the semiconductor apparatus, unlike a conventional interposer and organic substrate in which two or more layers of cores are applied on a motherboard as a packaging substrate, and thereby completed the invention. In a process of embodying such a packaging substrate, a buffer layer formed evenly on the inner diameter space of a core via is required for forming an electrically conductive layer having a comparatively even thickness, in order to prevent problems such as short circuit even inside a core via of a glass substrate. The present application applies a core seed layer through sputtering described below.

Figure 2:
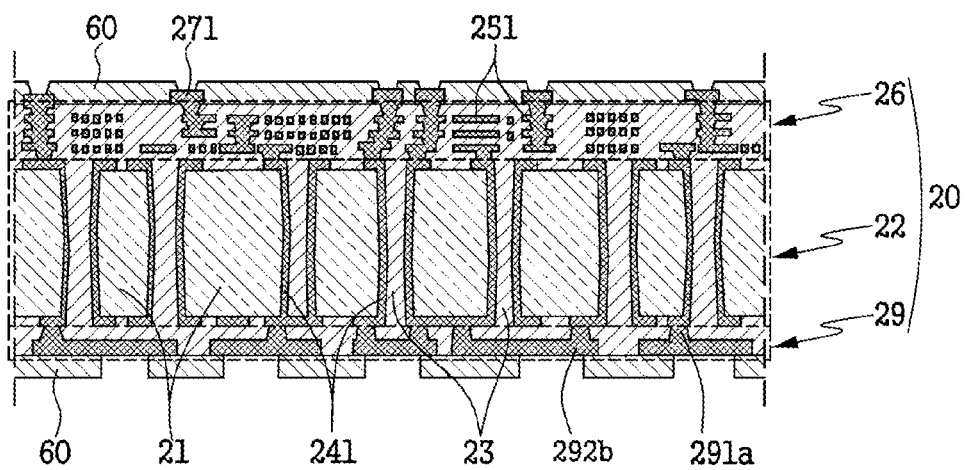
FIG. 2 is a conceptual view for illustrating a cross section of a packaging substrate according to another embodiment.
Figure 3:
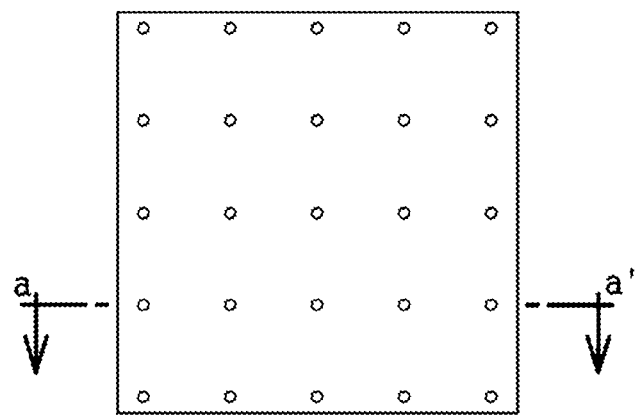
FIG. 3 are conceptual views for illustrating (a) a top view of a substrate where core vias are formed, and (b) a core via by a cross section in a-a' direction.
Figure 3:
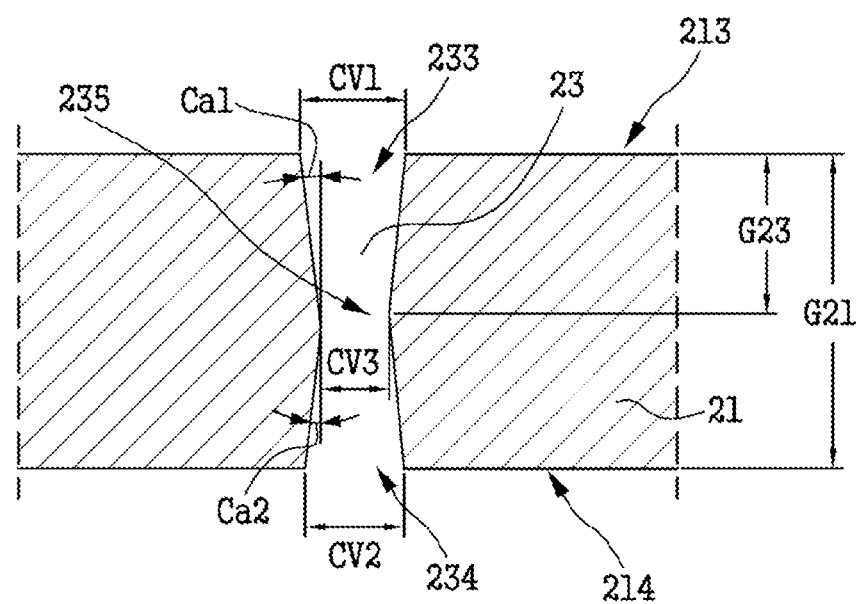
Figure 4:
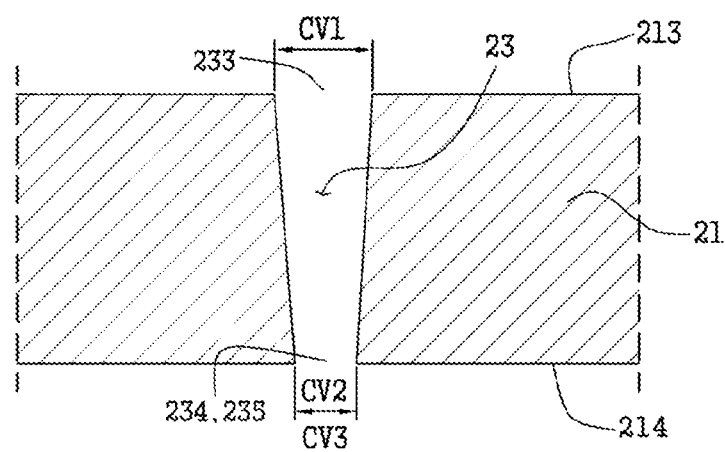
FIGS. 4 (*a*) and (*b*) are conceptual views for illustrating a shape of cross sections of a core via applied in the embodiment, respectively.
Figure 4:
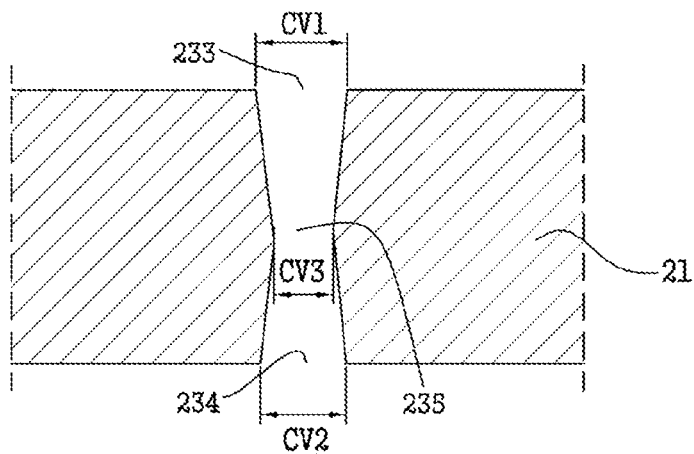
Figure 5:
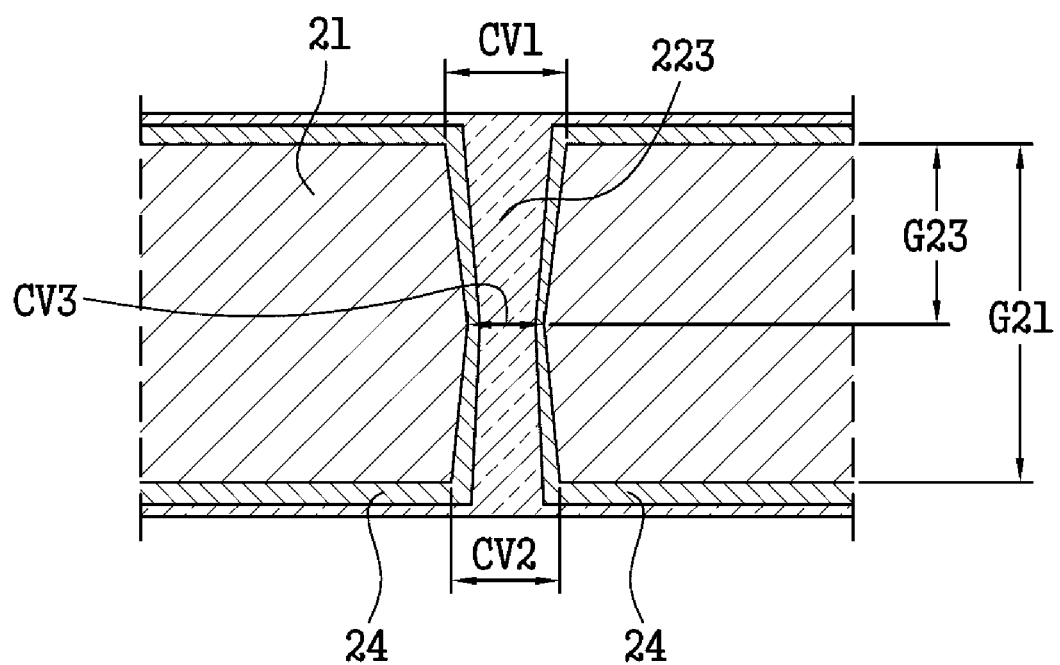
FIG. 5 is a conceptual view of which includes the embodiment of FIG. 4 (*b*) further including a core insulating layer.
Figure 6:
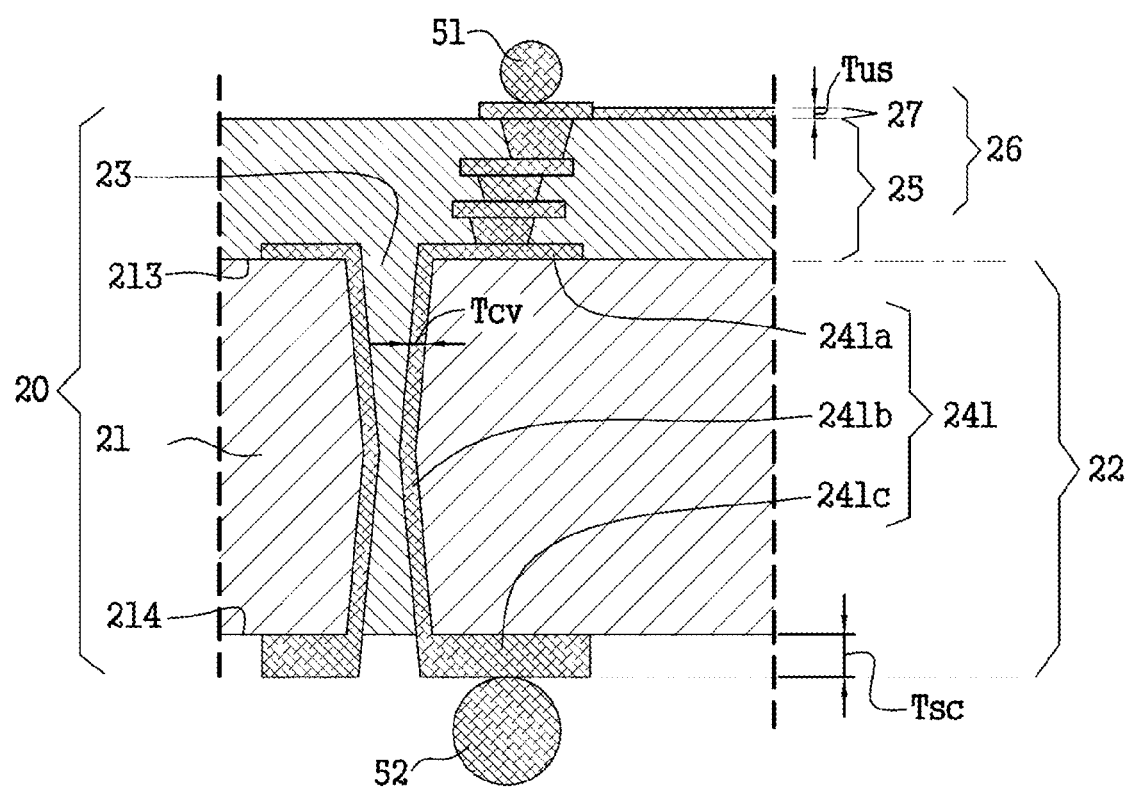
FIG. 6 is a detailed conceptual view for illustrating a part of cross sections of a packaging substrate according to the embodiment.
Figure 7:
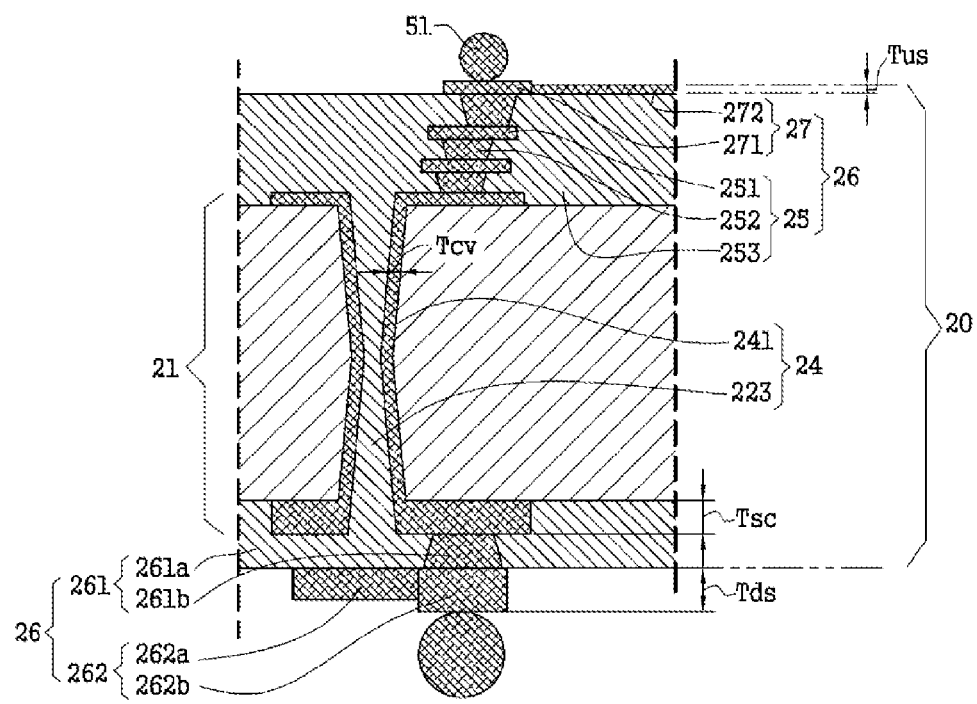
FIG. 7 is a detailed conceptual view for illustrating a cross section of a packaging substrate according to another embodiment.

FIG. 1 is a conceptual view for illustrating a cross section of a semiconductor apparatus according to one embodiment, FIG. 2 is a conceptual view for illustrating a cross section of a packaging substrate according to another embodiment, FIG. 3 are conceptual views for illustrating (a) a top view of a substrate where core vias are formed, and (b) a core via by a cross section in a-a' direction, FIGS. 4 (a) and (b) are conceptual views for illustrating a shape of cross sections of a core via applied in the embodiment, respectively, and FIG. 5 is a conceptual view of which includes the embodiment of FIG. 4 (b) further including a core insulating layer. FIG. 6 is a detailed conceptual view for illustrating a part of cross sections of a packaging substrate according to the embodiment. FIG. 7 is a detailed conceptual view for illustrating a cross section of a packaging substrate according to another embodiment. Hereinafter, the present disclosure will be described in more detail with reference to FIGS. 1 to 7.

A Semiconductor Apparatus 100

To achieve the above objective, a semiconductor apparatus 100 according to the embodiment includes a semiconductor element unit 30 where one or more semiconductor elements 32, 34, and 36 are disposed; a packaging substrate 20 electrically connected to the semiconductor element; and a motherboard 10 electrically connected to the packaging substrate, transmitting electrical signals of the semiconductor element and external, and connecting each other.

The packaging substrate 20 according to another embodiment includes a core layer 22 and an upper layer 26.

The semiconductor element unit 30 refers to the elements mounted on a semiconductor apparatus and is mounted on the packaging substrate 20 through a connecting electrode or the like. In detail, for example, a computation element (a first element 32 and a second element 34) such as a central processing unit (CPU) and a graphics processing unit (GPU), a memory element (a third element 36) such as a memory chip, or the like may be applied as the semiconductor element unit 30, but any semiconductor element capable of being mounted on a semiconductor apparatus may be applicable without limitation.

A motherboard such as a printed circuit board and a printed wiring board may be applied as the motherboard 10.

The packaging substrate 20 includes a core layer 22 and an upper layer 26 disposed on one surface of the core layer.

The packaging substrate 20 may further include a lower layer 29 disposed under the core layer, optionally.

The core layer 22 includes a glass substrate 21; a plurality of core via 23 penetrating through the glass substrate 21 in a thickness direction; and a core distribution layer 24 disposed on a surface of the glass substrate or a surface of the core via, and where an electrically conductive layer at least a part of which electrically connect an electrically conductive layer of the first surface and an electrically conductive layer of the second surface through the core via, is disposed.

The glass substrate 21 has a first surface 213 and a second surface 214 facing each other, and the two surfaces are substantially parallel to each other and have a substantially uniform thickness throughout the glass substrate.

A core via 23 penetrating through the first surface and the second surface is disposed at the glass substrate 21.

Conventionally, a silicon substrate and an organic substrate were applied to the packaging substrate of the semiconductor apparatus, in a shape of being stacked. In case of a silicon substrate, when it is applied to a high-speed circuit, a parasitic element effect may occur due to its semiconductor property, and there is an advantage of relatively large power loss. Also, in case of an organic substrate, it requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to the miniaturization of the patterns due to a material property of the polymer, etc., applied to an organic substrate.

In the embodiment, the glass substrate 21 is applied as a supporting body for the core layer 22 to solve these problems. Also, by applying a glass substrate and the core via 23 formed to penetrating through the glass substrate, it is possible to provide a packaging substrate 20 having a shortened electrical flow length, a smaller size, a faster response, and a lower loss property.

As the glass substrate 21, a glass substrate applied to semiconductor can be applied. For example, a borosilicate glass substrate, a non-alkali glass substrate, or the like may be applicable, but the present disclosure is not limited thereto.

The glass substrate 21 may have a thickness of 1,000 μm or less, 100 to 1,000 μm, or 100 to 700 μm. More specifically, the glass substrate 21 may have a thickness of 100 to 500 μm. Although applying a thinner packaging substrate is advantageous in that electrical signal transmission can be made more efficient, but the packaging substrate also should serve as a supporting body of packaging, so it is preferable to apply the glass substrate 21 having the above thickness. Here, the thickness of the glass substrate may be the thickness of the glass substrate itself except for the thickness of an electrically conductive layer on the glass substrate.

The core via 23 may be formed by removing a predetermined region of the glass substrate 21. In particular, it may be formed by etching a glass plate physically and/or chemically.

In detail, the core via 23 may be formed by applying a method of forming a defect (flaw) on the surface of the glass substrate by means of a laser or the like and then chemical etching, laser etching, or the like, but the present disclosure is not limited thereto.

The core via 23 comprises a first opening part 233 in contact with the first surface; a second opening part 234 in contact with the second surface; and a minimum inner diameter part 235 having the smallest inner diameter in the entire core via connecting the first opening part and the second opening part.

A diameter CV1 of the first opening part and a diameter CV2 of the second opening part may substantially differ, or a diameter CV1 of the first opening part and a diameter CV2 of the second opening part may be substantially equal.

The minimum inner diameter part may be disposed in the first opening part or the second opening part. In this case, a core via may be a cylindrical-type or a (truncated) trigonal-pyramid-type. In this case, a diameter CV3 of the minimum inner diameter part corresponds to a diameter of the smaller one between the first opening part and the second opening part.

The minimum inner diameter part may be disposed between the first opening part and the second opening part. In this case, the core via may be a barrel-type core via. In this case, the diameter CV3 of the minimum inner diameter part may be smaller than a larger one between a diameter of the first opening part and a diameter of the second opening part.

The minimum inner diameter part may have an average diameter of 50 to 95 μm.

The minimum inner diameter part may satisfy the condition of Equation 1 below.

$$0.83 \times D_{90} \leq D_{50} \leq 1.25 \times D_{10} \quad \text{[Equation 1]}$$

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

The minimum inner diameter may have an average diameter of 55 to 85 μm, or 60 to 70 μm.

In further detail, the minimum inner diameter may satisfy the condition of Equation 1-1 below.

$$0.88 \times D_{90} \leq D_{50} \leq 1.18 \times D_{10} \quad \text{[Equation 1-1]}$$

In the Equation 1-1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

In detail, a target opening part which is a larger one between the first surface opening part diameter and the second surface opening part diameter, may have an average diameter of 70 to 120 μm.

In detail, a target opening part which is a larger one between the first surface opening part diameter and the second surface opening part diameter may satisfy the condition of Equation 2 below.

$$0.9 \times D_{90} \leq D_{50} \leq 1.1 \times D_{10} \quad \text{[Equation 2]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In detail, a target opening part which is a larger one between the first surface opening part diameter and the second surface opening part diameter, may have an average diameter of 80 to 105 μm.

In detail, a target opening part which is a larger one between the first surface opening part diameter and the second surface opening part diameter may satisfy the condition of Equation 2-1 below.

$$0.92 \times D_{90} \leq D_{50} \leq 1.08 \times D_{10} \quad \text{[Equation 2-1]}$$

In the Equation 2-1, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In the core via, an average diameter of a target opening part which is a larger one between the first surface opening part diameter, which is a diameter at an opening part in contact with the first surface, and the second surface opening part diameter, which is a diameter at an opening part in contact with the second surface, may have a larger value than $D_{50}$, which is a value corresponding to 50% in the diameter distribution of a target opening part.

The diameter distribution described above, is evaluated based on a diameter which is observed and measured by microscope in the cross-section, after dividing prepared samples into 9 compartments (3×3), and processing of cutting the samples of 5 areas of top left, bottom left, center, top right, and bottom right.

A thickness of an electrically conductive layer measured at a larger one between the diameter (CV1) of the first opening part and the diameter (CV2) of the second opening part, may be same as or thicker than a thickness of an electrically conductive layer formed on a part CV3 having the minimum inner diameter among the core vias.

The core via 23 may be disposed in the number of 100 to 3000, or 100 to 2500, or 225 to 1024 based on a unit area (1 cm×1 cm) of the glass substrate 21. When the core via satisfies the above pitch condition, the formation of an electric conductive layer, etc., and the performance of a packaging substrate can be improved.

The core via 23 may be disposed at the glass substrate 21 in a pitch of 1.2 mm or less, may be disposed in a pitch of 0.12 to 1.2 mm, may be disposed in a pitch of 0.3 to 0.9 mm. In this case, it is advantageous to form an electrically conductive layer, etc., while maintaining the mechanical properties of the glass substrate above certain level.

The core distribution layer 24 comprises a core distribution pattern 241, which is electrically conductive layers for electrically connecting the first surface 213 and the second surface 214 of the glass substrate 21 through a through-via (core via); and a core insulating layer 223 surrounding the core distribution pattern 241.

The core layer 22 comprises an electrically conductive layer formed thereon through a core via and thus serves as an electrical passage passing through the glass substrate 21. Also, the core layer 22 may connect upper and lower parts of the glass substrate 21 with a relatively short distance to have faster electrical signal transmission and lower power loss property.

The core distribution pattern 241 comprises patterns that electrically connect the first surface 213 and the second surface 214 of the glass substrate 21 through the core via 23. Specifically, the core distribution pattern 241 comprises a first surface distribution pattern 241a, which is an electrical conductive layer disposed on at least a part of the first surface 213, a second surface distribution pattern 241c, which is an electrical conductive layer disposed on at least a part of the second surface 214, and a core via distribution pattern 241b, which is an electrical conductive layer for electrically connecting the first surface distribution pattern 241a and the second surface distribution pattern 241c to each other through the core via 23. As the electrically conductive layer, for example, a copper plating layer may be applicable, but the present application is not limited thereto.

The core via 23 comprises a first opening part 233 connecting the first surface; a second opening part 234 connecting the second surface; and a minimum inner diameter part 235 having the smallest inner diameter in the entire core via connecting the first opening part and the second opening part.

The glass substrate 21 serves as an intermediate role and an intermediary role for connecting a semiconductor element 30 disposed on the upper part of the glass substrate 21 and a motherboard 10 disposed under the lower part of the glass substrate 21, respectively, and the core via 23 serves as a passage for transmitting electrical signals thereof, thereby facilitating signal transmission.

At a cross sectional view of the core via 23, the shape may be that a diameter of one opening part is larger than a diameter of the other opening part based on the thickness of the glass substrate (refer to FIG. 4 (b)) or may be a barrel-type core via overall that a diameter of an inner diameter part at middle is smaller.

The core via 23 has a diameter CV1 which is a diameter at the first opening part, a diameter CV2 which is a diameter at the second opening part, and a diameter CV3 which is a diameter at the minimum diameter part.

A diameter CV1 of the first opening part may be substantially same or different from a diameter CV2 of the second opening part at the core via 23.

A core via 22 has a part with a smaller diameter than other parts in the inner diameter from a first opening part to a second opening part, and this part is so called a minimum inner diameter part.

When the core via 22 has a narrowing section at least a part therein, a diameter of a minimum inner diameter part is 50% to 99%, or 70% to 95% based on the bigger one between a diameter CV1 of a first opening part and a diameter CV2 of a second opening part. When a core via has this narrowing section, a formation of an electrically conductive layer may be proceeded easily.

When the entire length G21 of the core via is 100%, the point at which the minimum inner diameter part is located may be the point G23 of 40% to 60% based on the first opening part, and may be the point of 45% to 55%. When the minimum inner diameter part is at the position described above, based on the entire length of core via, the design of electrically conductive layer of packaging substrate and the process of forming electrically conductive layer may be easier.

A diameter of larger one between the diameter CV1 of the first opening part and the diameter CV2 of the second opening part and a size CV3 of the minimum inner diameter may have a ratio of 1:0.65 to 0.99, or 1:0.72 to 0.95. When the core via has an inner diameter size narrowed in such a range, the formation of an electrically conductive layer and the like can be made more smoothly.

A core via 22 may have an angle of 8 degrees or less of an inner surface observed in a cross section of the core via into a thickness direction based on perpendicular to the first surface, wherein the inner surface is a surface from an opening part having a larger diameter between an opening part in contact with the first surface and an opening part in contact with the second surface, to a minimum inner diameter part.

The angle (Ca1) of the inner diameter surface connecting the inner diameter of the minimum inner diameter part and the first opening part, and the angle (Ca2) of the inner diameter surface connecting the inner diameter part of the minimum inner diameter part and the second opening part, may have a ratio of 1:0.7 to 1.3. In this case, since the angle difference between the inner diameter surface of the core via starting from the first opening and the inner diameter surface of the core via starting from the second opening is insignificant, the subsequent plating process, etc. may proceed more smoothly.

The angle is evaluated as an angle with an imaginary reference line perpendicular to the first surface or the second surface, and evaluated as an absolute value regardless of the direction (hereinafter the same).

A larger angle between the angle (Ca1) of the inner diameter surface connecting the inner diameter of the minimum inner diameter part and the first opening part, and the angle (Ca2) of the inner diameter surface connecting the inner diameter of the minimum inner diameter part and the second opening part, may be degree of 8 or less, may be degree of 0.1 to 8, and may be degree of 0.5 to 6.5. In the case of having such an angle, the efficiency of subsequent processes such as plating can be further improved.

A thickness of an electrically conductive layer measured at a larger one between the diameter (CV1) of the first opening part and the diameter (CV2) of the second opening part, may be same as or thicker than a thickness of an electrically conductive layer formed on a part CV3 having the minimum inner diameter among the core vias.

The core distribution layer 24 is an electrically conductive layer formed on a glass substrate, and may satisfy that a cross-cut adhesion test value according to ASTM D3359 is 4B or greater, and specifically may satisfy that the cross-cut adhesion test value is 5B or greater. Also, an electrically conductive layer which is a core distribution layer 24, may have an adhesive strength of 3 N/cm or more and a bonding strength of 4.5 N/cm or more with respect to the glass substrate 21. When such a degree of bonding strength is satisfied, it has a sufficient bonding strength between a substrate and an electrically conductive layer, to be applied as a packaging substrate.

An upper layer 26 is disposed on the first surface 213.

The upper layer 26 may include an upper distribution layer 25 and an upper surface connecting layer 27 disposed on the upper distribution layer 25, and the uppermost surface of the upper layer 26 may be protected by a cover layer 60 having an opening part formed thereon, which is capable of being in direct contact with a connecting electrode of the semiconductor element unit.

The upper distribution layer 25 includes an upper insulating layer 253 disposed on the first surface; and an upper distribution pattern 251 that has a predetermined pattern and is an electrically conductive layer at least a part of which is electrically connected to the core distribution layer 24, and built in the upper insulting layer.

Anything applied as an insulating layer to a semiconductor element or a packaging substrate, is applicable to the upper insulating layer 253, for example, an epoxy-based resin comprising a filler may be applied, but the present disclosure is not limited thereto.

The insulating layer may be formed by a method of forming and hardening a coating layer, or by a method of laminating an insulating film which is being filmed in a state of non-hardened or semi-hardened to a core layer and hardening it. In this time, when a method of pressure sensitive lamination and the like is applied, the insulator is embedded even in the space inside a core via, and thus efficient process proceeding can be made. Also, even though plural-layered insulating layers are applied with being stacked, substantial distinction between the layers may be difficult, so that a plurality of insulating layer are collectively referred to as an upper insulating layer. Also, the core insulating layer 223 and the upper insulating layer 253 may be applied with the same insulating material, and in this case, the boundary therebetween may not be substantially distinguished.

The upper distribution pattern 251 refers to an electrically conductive layer disposed in the upper insulating layer 253 in a predetermined form. For example, it may be formed by a method of a build-up layer method. In detail, the upper distribution pattern 251 where electrically conductive layer is vertically or horizontally formed in a desired pattern, may be formed by repeating a process of: forming an insulating layer, removing an unnecessary part of the insulating layer and then forming an electrically conductive layer through a method of copper plating and the like, removing an unnecessary part of the electrically conductive layer and then forming an insulating layer on this electrically conductive layer again, and removing an unnecessary part again and then forming an electrically conductive layer through a method of plating and the like.

Since the upper distribution pattern 251 is disposed between the core layer 22 and the semiconductor element unit 30, it is formed to at least partially includes a fine pattern so that the transmission of electrical signals with the semiconductor element unit 30 may proceed smoothly and a desired complicated pattern may be sufficiently accommodated. In this case, the fine pattern may have a width and an interval of about less than 4 µm, 3.5 µm or less, 3 µm or less, 2.5 µm or less, or 1 to 2.3 µm, respectively. The interval may be an interval between fine patterns neighboring to each other (Hereinafter, the description of the fine pattern is the same).

In order to form the upper distribution pattern 251 to include a fine pattern, at least two or more methods are applied in the embodiment.

One of them, is to apply a glass substrate 21, as a glass substrate 21 of a packaging substrate. The glass substrate 21 can have a considerably flat surface property with a surface roughness (Ra) of 10 angstroms or less, and thereby minimizing the influence of surface morphology of a supporting substrate on formation of the fine pattern.

The other one, is based on the property of the insulating layer. In case of the insulating layer, a filler component is often applied in addition to resin, and inorganic particles such as silica particles may be applicable as the filler. When the inorganic particles are applied to the insulating layer as the filler, the size of the inorganic particles can affect whether to form the fine pattern, and therefore, the insulating layer in the present disclosure applies particle fillers with an average diameter of about 150 nm or less, and in detail, including particle fillers with an average diameter of 1 nm to 100 nm. Such a characteristic can minimize the influence of the insulating layer itself on the formation of an electrically conductive layer with a width of several micrometer-unit, while maintaining necessary properties for the insulating layer at a certain level or more, and can also help to form a fine pattern with good adhesion onto the surface, due to the fine surface morphology.

The upper surface connecting layer 27 includes an upper surface connecting pattern 272 disposed in the upper insulating layer 253, and at least a part of which is electrically connected to the upper distribution pattern 251, and an upper surface connecting electrode 271, electrically connecting the semiconductor element unit 30 and the upper surface connecting pattern 272. The upper surface connecting pattern 272 may be disposed on one surface of the upper insulating layer 253 or may be embedded with at least a part of which is being exposed on the upper insulating layer. For example, when the upper surface connecting pattern is disposed on one side of the upper insulating layer, the upper insulating layer may be formed by a method of plating and the like, and when the upper surface connecting pattern is embedded with at least a part of which is being exposed on the upper insulating layer, it may be the one which is formed by forming a copper plating layer and the like, and then a part of an insulating layer or electrically conductive layer is removed by a method of surface polishing, surface etching and the like.

The upper surface connecting pattern 272 may at least partially include a fine pattern like the above-described upper distribution pattern 251. The upper surface connecting pattern 272 including the fine pattern like this may enable a larger number of elements to be electrically connected to one another even in a narrow area, facilitate electrical signal connection between elements or with the external, and more integrated packaging is possible.

The upper surface connecting electrode 271 may be connected to the semiconductor element unit 30 directly through a terminal and the like or via an element connecting unit 51 such as a solder ball.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected via a board connecting unit such as a solder ball. Also, the second surface distribution pattern 241c may be connected to the motherboard 10 via the lower layer 29 disposed under the core layer 22.

The lower layer 29 includes a lower distribution layer 291 and a lower surface connecting layer 292.

The lower distribution layer 291 includes i) a lower insulating layer 291b at least a part of which is in contact with the second surface 214; and ii) a lower distribution pattern 291a being embedded in the lower insulating layer and having a predetermined pattern, and at least a part of which is electrically connected to the core distribution layer.

The lower surface connecting layer 292 includes i) a lower surface connecting electrode 292a electrically connected to the lower surface connecting pattern and may further include ii) a lower surface connecting pattern 292b at least a part of which is electrically connected to the lower distribution pattern, and at least a part of which is exposed to one surface of the lower insulating layer.

The lower surface connecting pattern 292b, which is a part connected to the motherboard 10, may be formed as a non-fine pattern wider than the fine pattern, unlike the upper surface connecting pattern 272, for more efficient transmitting of electrical signals.

Not applying a substantially additional different substrate other than the glass substrate 21 to the packaging substrate 20 disposed between the semiconductor element unit 30 and the motherboard 10, is one feature of the present disclosure.

Conventionally, an interposer and an organic substrate were applied with being stacked between connection of the element and the motherboard. It is considered that such a multi-stage form has been applied in at least two reasons. One reason is that there is a scale problem in directly bonding the fine pattern of the element to the motherboard, and the other reason is that problem of wiring damage may occur due to a difference in thermal expansion coefficient during the bonding process or during the driving process of the semiconductor apparatus. The embodiment has solved these problems by applying the glass substrate with a thermal expansion coefficient similar to that of the semiconductor element, and by forming a fine pattern with a fine scale enough to mount the elements on the first surface of the glass substrate and its upper layer.

In the embodiment, a thickness of a thinner one among electrically conductive layers of the core distribution layer 24 may be the same as or thicker than a thickness Tus of a thinner one among electrically conductive layers of the upper layer 26. When a thickness of a thinner one among electrically conductive layers of the core distribution layer 24 is the same as or thicker than the a thickness Tus of a thinner one among electrically conductive layers of the upper layer 26, electrical signal transmittance can be made more efficient between an element and a motherboard.

A thickness Tsc of a thinner one among the second surface distribution pattern 241c in the embodiment, may be thicker than a thickness Tus of a thinner one among the upper surface connecting pattern 272.

A thickness Tds of a thicker one among the lower surface connecting electrode 292a in the embodiment, may be thicker than a thickness Tsc of a thinner one among the second surface distribution pattern 241c.

The semiconductor apparatus 100 having a considerably thin packaging substrate 30 may make the overall thickness of the semiconductor apparatus thinner, and it is also possible to dispose a desired electrical connecting pattern even in a narrower area by applying the fine pattern. In detail, the packaging substrate 30 may have a thickness of about 2000 μm or less, about 1500 μm or less, or about 900 μm. Also, the packaging substrate 30 may have a thickness of about 120 μm or more, or about 150 μm or more. Due to the above-described characteristics, the packaging substrate can stably connect the element and the motherboard electrically and structurally even with a relatively thin thickness, thereby contributing to miniaturization and thinning of the semiconductor apparatus.

Figure 8:
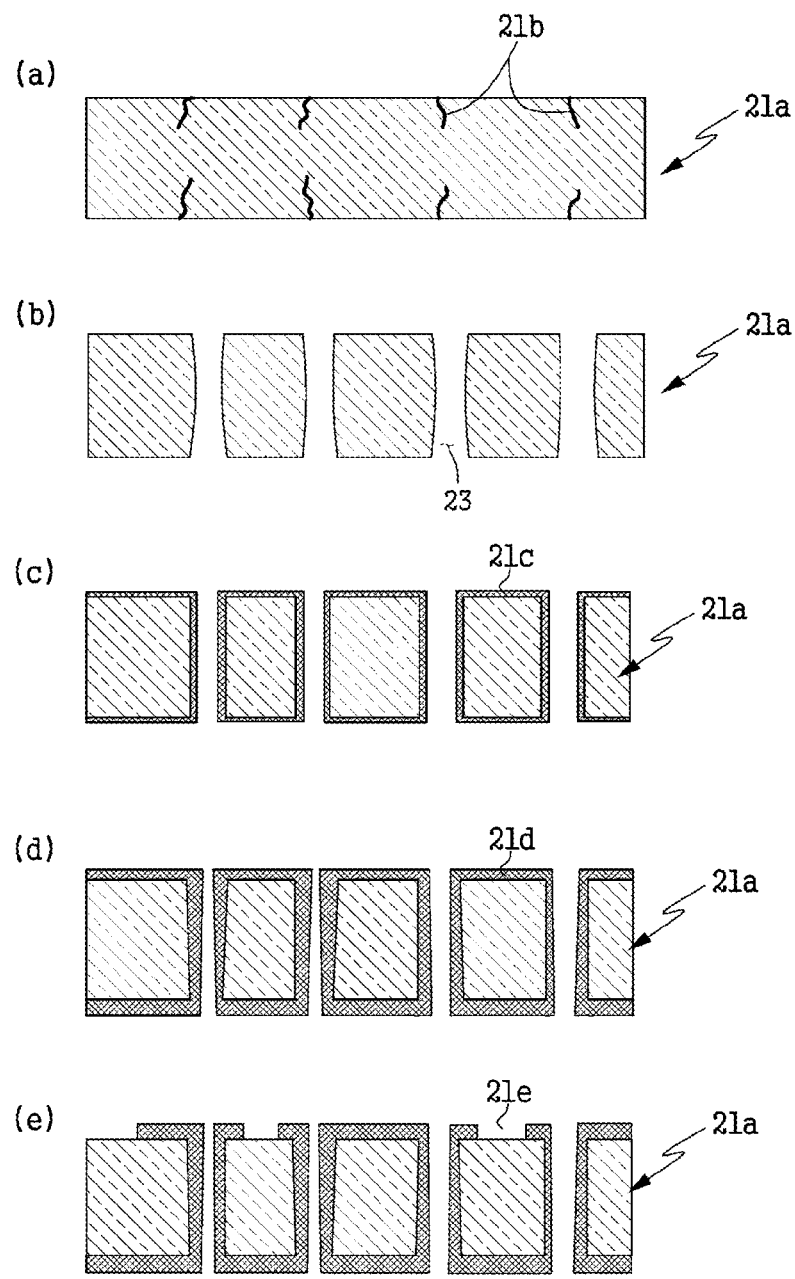
FIGS. 8 to 10 are flowcharts for illustrating a process of manufacturing a packaging substrate by using cross sections thereof according to the embodiment.
Figure 9:
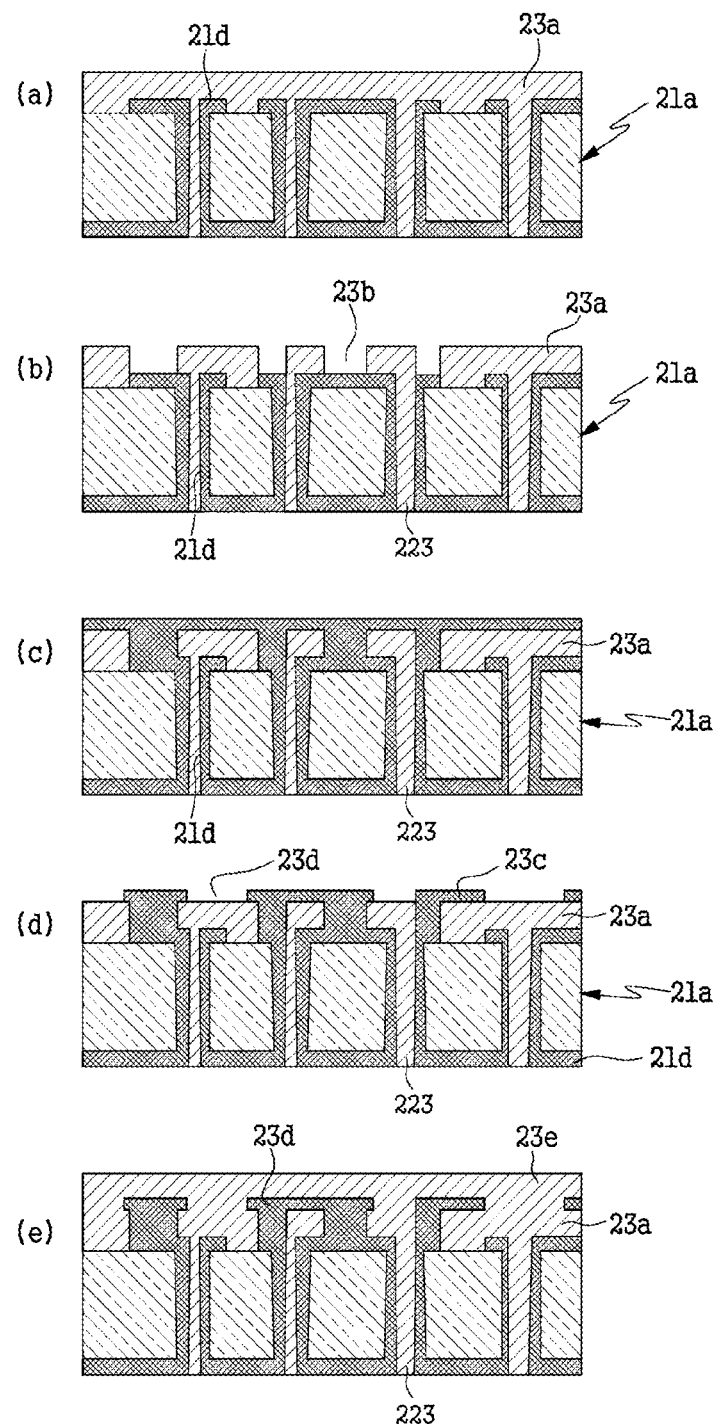
Figure 10:
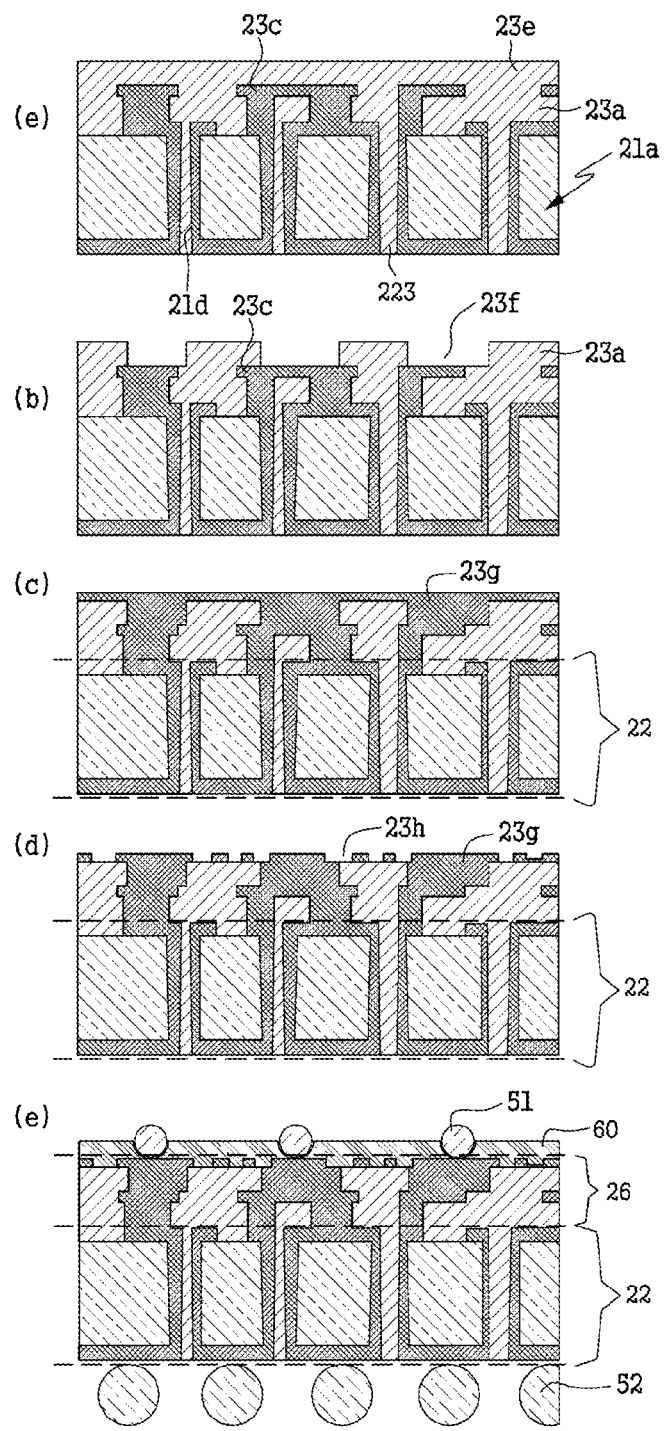

FIGS. 8 to 10 are flowcharts for illustrating a process of manufacturing a packaging substrate by cross sections thereof according to an embodiment of the present disclosure. A method of manufacturing the packaging substrate according to another embodiment of the present disclosure will be described below with reference to FIGS. 8 to 10.

A Method of Manufacturing a Packaging Substrate

A method of manufacturing a packaging substrate of the present disclosure comprises a preparation operation of forming a defect at predetermined positions of a first surface and a second surface of a glass substrate; an etching operation of preparing a glass substrate with a core via formed thereon by applying an etchant to the glass substrate where the defect is formed; a core layer forming operation of plating the surface of the glass substrate with the core via formed thereon, to form a core distribution layer which is an electrically conductive layer, and thereby forming a core layer; and an upper layer forming operation of forming an upper distribution layer, which is an electrically conductive layer surrounded by an insulting layer on one side of the core layer, and thereby manufacturing the packaging substrate described above.

The core layer forming operation may comprise a pretreatment process of preparing a pretreated glass substrate by forming an organic-inorganic composite primer layer containing a nanoparticle with amine-group on a surface of the glass substrate where the core via is formed; and a plating process of plating a metal layer on the glass substrate which is pretreated.

The core layer forming operation may comprise a pretreatment process of preparing a pretreated glass substrate by forming a metal-containing primer layer through sputtering on a surface of the glass substrate where the core via is formed; and a plating process of plating a metal layer on the glass substrate which is pretreated.

An insulating layer forming operation may be further comprised between the core layer forming operation and the upper layer forming operation.

The insulating layer forming s operation may be an operation of positioning an insulating film on the core layer and performing pressure sensitive lamination to form a core insulating layer.

A method of manufacturing the packaging substrate will be described in more detail.

1) Preparation Operation (Glass Defect Forming Process): A glass substrate 21a having flat first surface and second surface was prepared, and a defect (groove) 21b was formed at a predetermined position on the surface of the glass substrate to form a core via. As the glass substrate, a glass substrate applied to a substrate for electronic apparatus, etc., for example, non-alkalic glass substrate, etc. is applicable, but not limited thereto. As a commercial product, product manufactured by manufacturers such as CORNING, SCHOTT, AGC may be applied. For formation of the defect (groove), a method of mechanical etching, laser irradiation, and the like can be applied.

2) Etching Operation (Core Via Forming Operation): On the glass substrate 21a where the defect (groove) 21b is formed, a core via 23 is formed through a physical or chemical etching process. During the etching process, the glass substrate forms vias in the parts with defect, and at the same time, the surface of the glass substrate 21a may be simultaneously etched. A masking film may be applied to prevent the etching of the glass surface, but the defective glass substrate itself may be etched in consideration of the inconvenience, etc. of the process of applying and removing the masking film, and in this case, a thickness of the glass substrate having the core via may be slightly thinner than the thickness of the first glass substrate.

3-1) Core Layer Forming Operation: An electrically conductive layer 21d is formed on the glass substrate. As for the electrically conductive layer, a metal layer containing copper metal may be applied representatively, but not limited thereto.

A surface of the glass (including a surface of a glass substrate and a surface of a core via) and a surface of the copper metal have different properties, so the adhesion strength is rather poor. In the present disclosure, the adhesion strength between the glass surface and the metal is improved by two methods, a dry method and a wet method.

The dry method is a method applying sputtering, that is, a method of forming a seed layer 21c inside the core via and on the glass surface through metal sputtering. For the formation of the seed layer, different kinds of metals such as titanium, chromium, and nickel may be sputtered with copper, etc., and in this case, it is considered that the adhesiveness of glass-metal is improved by surface morphology of glass, an anchor effect which is an interaction between metal particles, and the like.

The wet method is a method applying primer treatment, that is, a method of forming a primer layer 21c by performing pre-treatment with a compound having a functional group such as amine After pre-treatment by using a silane coupling agent depending on the degree of intended adhesion strength, primer treatment may be done with a compound or particles having an amine functional group. As mentioned above, a supporting body substrate of the present disclosure needs to be of high performance enough to form a fine pattern, and it should be maintained after the primer treatment. Therefore, when such a primer includes a nanoparticle, it is desirable to apply a nanoparticle with an average diameter of 150 nm or less, for example, a nanoparticle is desirable to be applied to a particle with amine functional group. The primer layer may be formed by applying an adhesive strength improving agent manufactured in CZ series by MEC Inc, for example.

In the seed layer/primer layer 21c, an electrically conductive layer may selectively form a metal layer in the state of removing a part where the formation of an electrically conductive layer is unnecessary, or not removing. Also, in the seed layer/primer layer 21c, a part where the formation of an electrically conductive layer is necessary, or a part where it is unnecessary, may be selectively processed to be an activated state or an inactivated state for metal plating. The processing to be an activated state or an inactivated state may be performed, for example, by using light irradiation treatment such as laser light of a certain wavelength, etc., chemical treatment, and the like. A copper plating method, etc. applied to manufacturing a semiconductor element may be applied to form the metal layer, but not limited thereto.

During the metal plating, a thickness of an electrically conductive layer formed, may be controlled by regulating several variables such as the concentration of plating solution, plating time, and type of additive to be applied.

When a part of the core distribution layer is unnecessary, it may be removed, and an etched layer 21e of a core distribution layer may be formed by performing metal plating to form an electrically conductive layer as a predetermined pattern, after the seed layer is partially removed or processed to be inactivated.

3-2) Insulating Layer Forming Operation: An insulating layer forming operation in which an empty space of a core via is filled with an insulating layer after the core distribution layer, which is an electrically conductive layer, is formed, may be performed. In this case, the one manufactured in a film type may be applied to the applied insulating layer, and for example, a method such as pressure sensitive laminating the film-type insulating layer may be applied. When proceeding the pressure sensitive laminating like this, the insulating layer may be sufficiently subsided to the empty space inside the core via to form a core insulating layer without void formation.

4) Upper Layer Forming Operation: It is an operation of forming an upper distribution layer including an upper insulating layer and an upper distribution pattern on a core layer. The upper distribution layer may be formed by a method of coating a resin composition forming an insulating layer 23a, or laminating an insulating film. For simplicity, applying a method of laminating an insulating film is desirable. The laminating of the insulating film may be proceeded by a process of laminating and then hardening, and in this case, if a method of the pressure sensitive lamination is applied, the insulating resin may be sufficiently subsided even into a layer where an electrically conductive layer is not formed inside the core via. The upper insulating layer is also in direct contact with a glass substrate at least in part thereof, and thus the one with a sufficient adhesive force is applied. Specifically, it is desirable that the glass substrate and the upper insulating layer have characteristics that satisfy an adhesion strength test value of 4B or more according to ASTM D3359.

The upper distribution pattern may be formed by repeating a process of forming the insulating layer 23a, forming an electrically conductive layer 23c to have a predetermined pattern, and forming an etched layer 23d of the electrically conductive layer by etching the unnecessary part, and in the case of an electrically conductive layer formed to neighbor with having an insulating layer disposed therebetween, it may be formed by a method of performing a plating process after forming a blind via 23b in the insulating layer. For formation of the blind via, a dry etching method such as laser etching and plasma etching, and a wet etching method using a masking layer and an etching solution may be applied.

5) Upper Surface Connecting Layer and Cover Layer Forming Operation: Upper surface connecting pattern and upper surface connecting electrode may be performed by a process similar to forming the upper distribution layer. Specifically, it may be formed by a method such as forming an etched layer 23f of an insulating layer 23e on the insulating layer 23e, and then forming an electrically conductive layer 23g again thereon, and then forming an etched layer 23h of the electrically conductive layer, but a method of selectively forming only an electrically conductive layer without applying a method of etching, may be also applied. A cover layer may be formed to have an opening part (not shown) at a position corresponding to the upper surface connecting electrode such that the upper surface connecting electrode to be exposed and directly connected to an element connecting unit, a terminal of an element, or the like.

6) Lower Surface Connecting Layer and Cover Layer Forming Operation: A lower distribution layer and/or a lower connecting layer, and optionally a cover layer (not shown) may be formed in a manner similar to the the upper surface connecting layer and the cover layer forming operation, described above.

Figure 11:
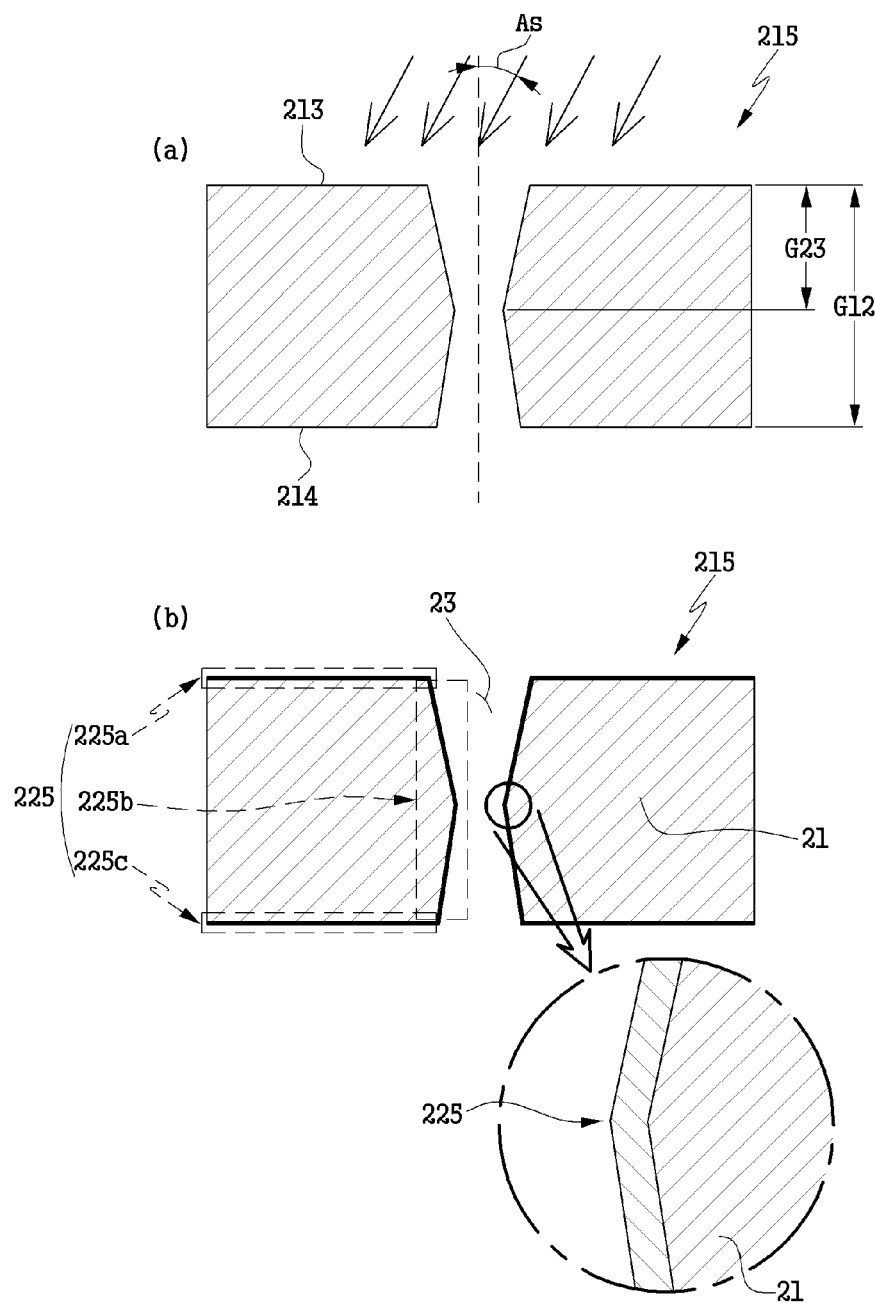
FIG. 11 is a conceptual view for illustrating a top view (a) of a glass substrate comprising a core via according to embodiments of the present application and a cross section (b) of the core via.
Figure 12:
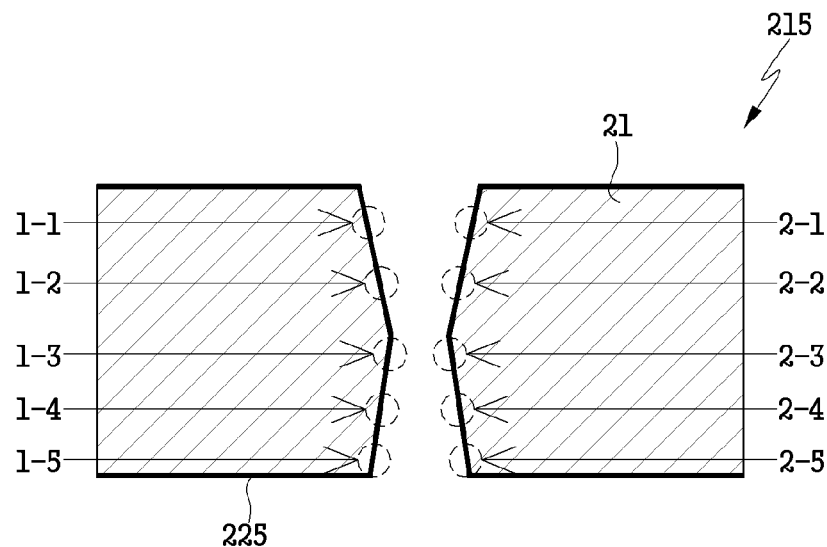
FIG. 12 is a cross section conceptual view of a core via for illustrating a measuring point applied during evaluation of a thickness deviation in embodiments of the present application.

FIG. 11 is a conceptual view for illustrating a top view (a) of a glass substrate comprising a core via according to embodiments of the present application and a cross section (b) of the core via. Hereinafter, referring FIG. 1 and FIG. 11, a packaging substrate comprising a glass substrate and its manufacturing method are disclosed.

A Substrate for a Semiconductor Packaging 215 and a Method for the Same

A substrate for a semiconductor packaging 215 according to another embodiment, i) a glass substrate 21 comprising a first surface 213 and a second surface 214 facing each other; ii) a plurality of core vias 23 passing through the glass substrate 21 in a thickness direction thereof; and iii) a core layer having a core seed layer as a seed for forming an electrically conductive layer on a surface of the core vias.

The substrate for a semiconductor packaging 215 may be an element of the above-described packaging substrate 20 of the semiconductor apparatus 100.

As the glass substrate 21, applying a glass substrate applied to a semiconductor area is preferrable. For example, a borosilicate glass substrate, a non-alkali glass substrate, or the like may be applicable, but the present application is not limited thereto.

The glass substrate 21 may have a thickness of 1,000 μm or less, 100 μm to 1,000 μm, or 100 μm to 700 μm. More specifically, the glass substrate 21 may have a thickness of 100 μm to 500 μm. Although applying a thinner packaging substrate is advantageous in that electrical signal transmission can be made more efficient, but the packaging substrate also should serve as a supporting body of packaging, so it is preferable to apply the glass substrate 21 having the above thickness. Here, the thickness of the glass substrate refers to the thickness of the glass substrate itself except for the thickness of the electrically conductive layer on the glass substrate.

The core vias 23 may be formed by removing a predetermined region of the glass substrate 21. In particular, the core via 23 may be formed by etching a glass plate physically and/or chemically.

In detail, the core via 23 may be formed by forming a defect (flaw) on the surface of the glass substrate by means of a laser or the like and then applying chemical etching, laser etching, or the like, but the present application is not limited thereto.

The core via 23 comprises a first opening part 233 in contact with the first surface; a second opening part 234 in contact with the second surface; and a minimum inner diameter part 235 having the smallest inner diameter in the entire core via from the first opening part 233 to the second opening part 234.

A diameter CV1 of the first opening part may be substantially different from a diameter CV2 of the second opening part. And a diameter CV1 of the first opening part may be substantially equal to a diameter CV2 of the second opening part.

The minimum inner diameter part may be disposed at the first opening part 233 or at the second opening part 234. In this case, the core via may be a cylindrical type core via or a (truncated) triangular pyramid type core via. In this case, a diameter CV3 of the minimum inner diameter part corresponds to the smaller one between the diameter of the first opening part and the diameter of the second opening part.

The minimum inner diameter part may be disposed between the first opening part and the second opening part. In this case, the core via 23 may be a barrel type core via. In this case, the diameter CV3 of the minimum inner diameter part may be smaller than the larger one between the diameter of the first opening part and the diameter of the second opening part.

The core via 23 comprises an opening part in contact with the first surface, an opening part in contact with the second surface, and a part having the minimum inner diameter within the core via. The minimum inner diameter part may be disposed at a point corresponding to 40 to 60% based on the first opening part, when a total length of the core via is designated as 100%. A core via comprising such a form may be more advantageous for having a value about a thickness ratio described below.

The core vias 23 may have "an opening part—thickness ratio" of 1:2 to 4, which refers to a ratio of an inner diameter at the opening part (larger one between a first surface opening part and a second surface opening part) and a thickness of the glass substrate. The core via 23 may have "a minimum inner diameter part-thickness ratio" of 1:2.5 to 6, which refers to a ratio of inner diameter at the minimum inner diameter part and a thickness of the glass substrate. A core via having such a ratio is more advantageous for forming a core seed layer comprising characteristics described below.

When the core seed layer 225 is formed by a method of sputter, because of a characteristic in connection with the narrow and long shape of the core via 23, the core seed layer 225 may not be partially sufficiently formed or may have different thickness therein. These core seed layers become a basis for forming an electrically conductive layer such as a copper layer by such a method like plating, and a thickness distribution of such an electrical conductive layer may affect speed and efficiency of transmitting electrical signals, so that controlling the thickness distribution of electrical conductive layers is required.

In the present application, a first thickness and a second thickness are measured, wherein the first thickness and the second thickness are thicknesses of the core seed layer 225 measured at positions facing each other at the inner diameter surface of the core via 23. And then, through a ratio of the first thickness and the second thickness, it is confirmed whether a core seed layer has an overall even thickness or not.

In detail, a core via 23 in which a core seed layer 225 is disposed on the inner diameter surface is observed at the cross section, and then a thickness of the core seed layer 225 is measured at a certain position. Because the core seed layer 225 itself may comprise a rough surface, values are measured in three to five times with changing the position finely even at one point and averaged values is evaluated as a thickness value.

As the core seed layer 225, a thickness distribution rate according to the below equation 1 may be 90% or less, 83% or less, or 67% or less. When a core seed layer has such a thickness distribution rate, a core seed layer with relatively even thickness may be provided.

$$\text{a thickness distribution rate} = \{(\text{a max thickness of the core seed layer} - \text{a min thickness of the core seed layer})/\text{an average thickness of the core seed layer}\} * 100\% \quad [\text{equation 1}]$$

In the equation 1, the max thickness is a thickness having a maximum value among the measured thickness at the thickness sample of the core seed layer, the min thickness is a thickness having a minimum value among the measured thickness at the thickness sample, and the average thickness is an average value of the thickness sample.

The core seed layer 225 may be an average thickness of 30 nm to 200 nm, 50 nm to 170 nm. The core seed layer with the above average thickness may provide a relatively even electrically conductivity intended to this disclosure.

The core seed layer 225 may further have characteristics below.

A thicknesses of core seed layers placed at positions facing each other are matched as a first thickness and a second thickness like 1-1 and 1-2, and a ratio of the first thickness and the second thickness deems a thickness ratio. Because a core seed layer itself may have a rough surface, values are measured in three to five times with changing the position finely even at one point and averaged values is evaluated as a thickness value. Further, thicknesses of a core seed layer at positions facing each other are matched as a first thickness and a second thickness like 1-1 and 1-2, and a thickness ration is a calculated one from these as a ratio.

The thickness ratio may be 1:0.4 to 4.5, 1:0.5 to 3.0, or 1:0.7 to 2.0. When having such a thickness ratio, the core seed layer 225 has a comparatively even thicknesses at positions facing each other.

The thickness ratios measured at three or five positions different in the height from each other at the inner diameter surface of the core via 23 may have a standard deviation of 1.5 or less, 1 or less, or 0.8 or less. This means the three or five positions having different height from each other have comparatively even thicknesses. Here, the term, three or five positions having different height from each other, refers to positions designated with comparatively even intervals considering a total length of the core via, but the position intervals do not have to be perfectly same.

In detail, the inner diameter surface of the core via may have a different thickness depending on the height thereof based on the second surface, and such a difference in thickness is easy to occur because of properties of a narrow and long shaped core via. However, a core seed layer 225 having characteristics described in the above may control this unevenness of thickness, thereby it leads a core seed layer to have sufficient even feature at or above a proper level.

The core seed layer 225, in detail, comprises a first surface core seed layer 225a disposed on the first surface, a core via seed layer 225b disposed on the inner diameter surface on a core via, and a second surface core seed layer 225c disposed on the second surface, connected orderly from each other.

The detailed characteristics of the core seed layer 225 described in the above is applied to the core via seed layer 225b.

Figure 13:
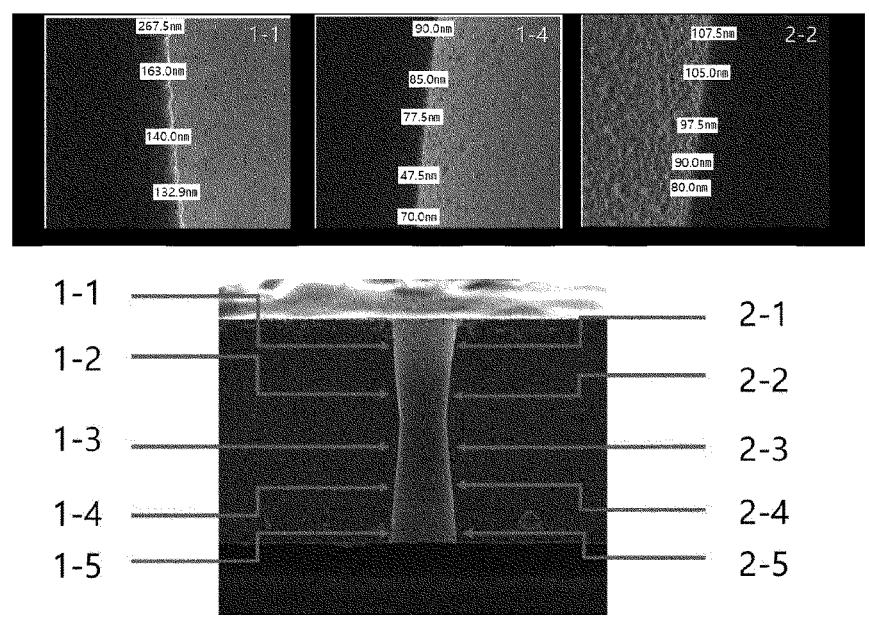
FIG. 13 is a picture, for example, showing thickness measurement of a core seed layer measured according to embodiments of the present application.
Figure 14:
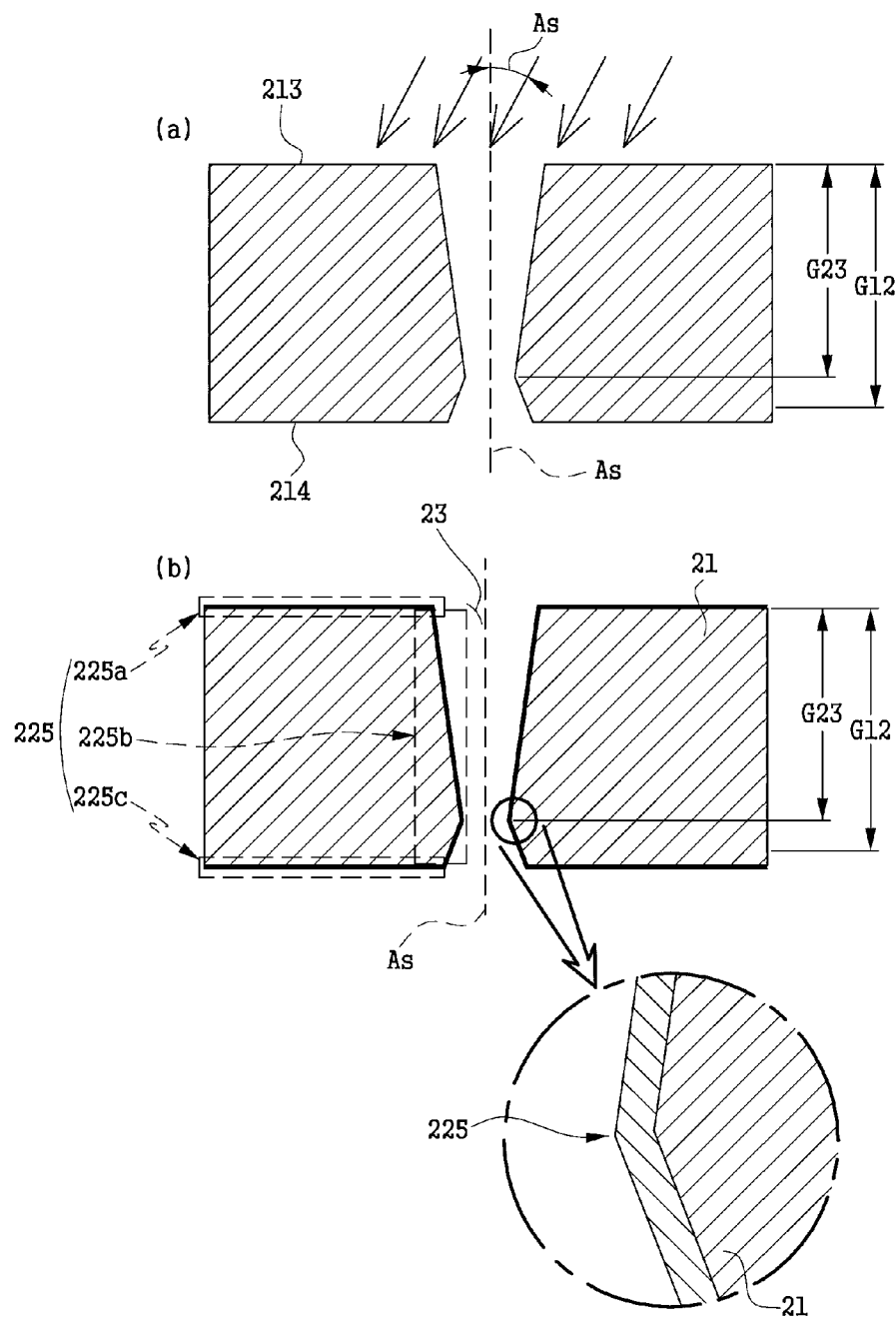
FIG. 14 is a conceptual view for illustrating a top view (a) of a glass substrate comprising a core via according to other embodiments and a cross section (b) of the core via.
Figure 15:
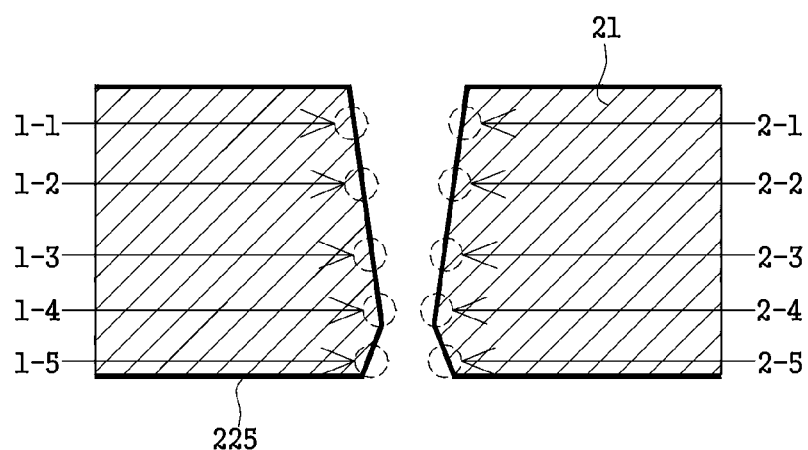
FIG. 15 is a cross section conceptual view of a core via for illustrating a measuring point applied during evaluation of a thickness deviation in other embodiments of the present application.

As presented in FIG. 13, thicknesses, thickness ratios, the standard deviation of a core via seed layer are presented below. A picture of sample 1 is presented in FIG. 13.

is possible to form a core seed layer having thickness uniformity above a certain level even inside the core via more efficiently.

Hereinafter, the present disclosure will be described in more detail through specific examples. The following examples are only examples to help the understanding of the present disclosure, and the scope of the present disclosure is not limited thereto.

TABLE 0

| sample 1 | 1-1 | 2-1 | Thickness ratio* | 1-2 | 2-2 | Thickness ratio |
|---|---|---|---|---|---|---|
| thickness* | 175.85 | 126.5 | 1.39 | 105.63 | 96 | 1.10 |
| sample2 | 1-1 | 2-1 | Thickness ratio | 1-2 | 2-2 | Thickness ratio |
| thickness | 51.5 | 88.14 | 0.58 | 67 | 37.5 | 1.79 |
| sample3 | 1-1 | 2-1 | Thickness ratio | 1-2 | 2-2 | Thickness ratio |
| thickness | 59.32 | 42.54 | 1.39 | 141.04 | 36.54 | 3.86 |
| sample4 | 1-1 | 2-1 | Thickness ratio | 1-2 | 2-2 | Thickness ratio |
| thickness | 61.3 | 158.58 | 0.39 | 36.46 | 72.54 | 0.50 |
| sample 1 | 1-3 | 2-3 | Thickness ratio | 1-4 | 2-4 | Thickness ratio |
| thickness | 49.5 | 54.5 | 0.91 | 74 | 58 | 1.28 |
| sample2 | 1-3 | 2-3 | Thickness ratio | 1-4 | 2-4 | Thickness ratio |
| thickness | 65.5 | 98.5 | 0.66 | 61 | 76 | 0.80 |
| sample3 | 1-3 | 2-3 | Thickness ratio | 1-4 | 2-4 | Thickness ratio |
| thickness | 193.04 | 57.04 | 3.38 | 102.64 | 77.5 | 1.32 |
| sample4 | 1-3 | 2-3 | Thickness ratio | 1-4 | 2-4 | Thickness ratio |
| thickness | 70.04 | 40 | 1.751 | 50.04 | 71.18 | 0.70 |
| sample1 | 1-5 | 2-5 | Thickness ratio | average | standard deviation | — |
| thickness | 274.2 | 87 | 3.15 | 1.566 | 0.74 | — |
| sample2 | 1-5 | 2-5 | Thickness ratio | average | standard deviation | — |
| thickness | 123.93 | 68 | 1.82 | 1.13 | 0.51 | — |
| sample3 | 1-5 | 2-5 | Thickness ratio | average | standard deviation | — |
| thickness | 226.02 | 37 | 6.11 | 3.212 | 1.62 | — |
| sample4 | 1-5 | 2-5 | Thickness ratio | average | standard deviation | — |
| thickness | 98.66 | 51.12 | 1.93 | 1.054 | 0.60 | — |

*A thickness is 5-point average value.
*A thickness ratio is calculated (1-1/2-1).

Hereinafter, a method of manufacturing a core seed layer will be described.

The method of manufacturing a core seed layer comprises a preparation operation and a sputter operation.

The preparation operation is for preparing a pre-treatment substrate comprising a glass substrate comprising a first surface and a second surface facing each other and a plurality of core vias passing through the glass substrate in a thickness direction. The detailed description on a glass substrate and a core via is overlapped with the above description and thus the further description is omitted. Also, the detailed description about a method of forming a core via on a glass substrate is the same as the description on a packaging substrate described below and thus the description is omitted here.

The sputter operation is for forming a core seed layer in the inner diameter surface of the core via by sputtering at a gun angle (As) of 10 to 90 degree based on a reference line which is vertical to the first surface. The gun angle may be 10 to 65 degree. The gun angle may be 15 to 55 degree, or 15 to 45 degree. The gun angle may be 10 to 35 degree. When sputtering is applied by applying such a gun angle, it Example 1—Manufacturing of a Packaging Substrate 1) Preparation Operation (Glass Defect Forming Process): A glass substrate 21a with a flat first surface and a flat second surface was prepared, and defects (grooves, 21b) were formed on the glass surface at a predetermined position for forming a core via. As the glass, borosilicate glass (from CORNING) was applied. A method of mechanical etching and laser irradiation were applied to the formation of the defect (groove).

2) Etching Operation (Core Via Forming Step): The core via 23 was formed on the glass substrate 21a where the defects (grooves, 21b) were formed, through a physical or chemical etching process. The core via were formed to have a first opening part in contact with the first surface; a second opening part in contact with the second surface; and a minimum inner diameter part, which is the area whose diameter is the narrowest in the entire core via from the first opening part to the second opening part. When a length of the entire core via deemed to 100%, the minimum inner diameter part was disposed at a point between 40% to 60% from the first opening part. In addition, the core via 22 had an angle of 8 degrees or less of an inner surface observed in a cross section of the core via into a thickness direction based on perpendicular to the first surface.

3-1) Core Layer Forming Operation: An electrically conductive layer 21d was formed on a glass substrate. As the electrically conductive layer, a metal layer containing copper metal was applied. A dry method was applied for enhancing an adhesive strength between a surface of the glass substrate and a metal layer. The dry method was applied as a method comprising sputtering, that is, a method of forming a seed layer 21c inside the core via and on the glass surface through metal sputtering. For the formation of the seed layer, one or more different kinds of metals from titanium, chromium, and nickel were sputtered with copper, etc. A gun angle (As) was 45 degree based on a reference line which is vertical to the first surface.

A copper plating method applied to manufacturing a semiconductor element was applied to form the metal layer.

Example 2—Manufacturing of a Packaging Substrate

A packaging substrate was manufactured in the same manner as in Example 1, except that the position of the minimum inner diameter part of 2) was less than 40% based on the first opening part, and an angle when sputtering of 3-1) was changed to 55 degree.

Example 3—Manufacturing of a Packaging Substrate

A packaging substrate was manufactured in the same manner as in Example 1, except that an angle when sputtering of 3-1) was changed to 65 degree.

Example 4—Manufacturing of a Packaging Substrate

A packaging substrate was manufactured in the same manner as in Example 1, except that the position of the minimum inner diameter part of 2) was less than 40% based on the first opening part, and an angle when sputtering of 3-1) was changed to 90 degree.

Comparative Example 1—Manufacturing of a Packaging Substrate

A packaging substrate was manufactured in the same manner as in Example 1, except that the angle of the core via was more than 8 degree.

Comparative Example 2—Manufacturing of a Packaging Substrate

A packaging substrate was manufactured in the same manner as in Example 1, except that the angle of the core via was more than 8 degree, the position of the minimum inner diameter part of 2) was less than 40% based on the first opening part, and an angle when sputtering of 3-1) was changed to 65 degree.

Comparative Example 3—Manufacturing of a Packaging Substrate

A packaging substrate was manufactured in the same manner as in Example 1, except that the angle of the core via was more than 8 degree, the position of the minimum inner diameter part of 2) was less than 40% based on the first opening part, and an angle when sputtering of 3-1) was changed to 90 degree.

EXPERIMENTAL EXAMPLE—MEASUREMENT OF A FIRST THICKNESS, A SECOND THICKNESS, A RATIO, AND CORE VIA DISTRIBUTION

The distribution of core via of the packaging substrate is evaluated based on a minimum inner diameter which is observed and measured by microscope in the cross-section, after dividing prepared samples into 9 compartments (3×3), and processing of cutting the samples of 5 areas of top left, bottom left, center, top right, and bottom right, and the results are shown in Table 1.

TABLE 1

|  | example 1 | example 2 | example 3 | example 4 | Comparative example 1 | Comparative example 2 | Comparative example 3 |
|---|---|---|---|---|---|---|---|
| A sputter angle (degree) | 45 | 55 | 65 | 90 | 45 | 65 | 90 |
| Ca*((도)) | 8 or less | 8 or less | 8 or less | 8 or less | More than 8 | More than 8 | More than 8 |
| 1-n:2-n* | 1:0.4~4.5 | 1:0.4~4.5 | 1:0.4~4.5 | 1:0.4~4.5 | 1:0.4~4.5 | 1:0.2 | 1:0.5 |
| Thickness distribution ratio* (%) | 50 | 67 | 83 | 90 | 97 | 102 | 107 |
| position of the minimum inner diameter part *(%) | 40~60 | less than 40 | 40~60 | less than 40 | 40~60 | less than 40 | less than 40 |

Ca: an angle of an inner surface observed in a cross section of the core via into a thickness direction based on perpendicular to the first surface 1-n:2-n: a ratio of a first thickness and a second thickness of a core seed layer measured at positions facing each other a thickness distribution rate: {(a max thickness of the core seed layer–a min thickness of the core seed layer)/an average thickness of the core seed layer}*100% a position of a minimum inner diameter part: a relative position from the first opening part, when a length of the entire core via deemed to 100%.

Referring to table 1, examples 1 to 4 in which the Ca is 8 or less showed the thickness distribution rate of 90 or less, the 1-n:2-n: a ratio of 1:0.4-4.5, which are a relatively even thickness of a core seed layer. And a packaging substrate with these characteristics is considered that may fully and smoothly forward electrical signals to an element disposed at up or down side.

A packaging substrate according to embodiment has formed an electrically conductive layer having a proper thickness ratio, thereby it can achieve a signal transfer efficiently with having excellent characteristics of a glass substrate such as not occurring parasitic element effect, serving as a substrate supporter with sufficiently thin with enough strength, etc., It is considered that a glass substrate has poor adhesion with electrically conductive layer such as copper layer. Therefore, for preparing an electrically conductive layer having enough thickness through a method such as plating etc., a seed layer or a primer layer is necessary between a surface of a glass substrate and an electrically conductive layer. However, when these seed layer or a primer layer are formed too thick or having relatively non-even thickness, it may be hard to form an enough thick electrically conductive layer inside a core via which has limited inner diameter. That may lead a packaging substrate to have poor transfer speed between upper part and lower parts thereof.

Considering the above characteristics and for transfer an electrical signal efficiently, it is proper for a thickness of a seed layer or a primer layer to be applied thin and even with having specific thickness ratio, for a sputter angle to be 15 degree to 90 degree, and for the Ca to be 8 degree or less.

Although the desirable examples of the embodiment have been described above, the scope of the embodiment is not limited thereto, and various modifications and alterations made by those skilled in the art using the basic concept of the embodiment defined in the following claims also fall within the scope of the embodiment.

| DESCRIPTION OF FIGURE NUMBERS | |
|---|---|
| 100: Semiconductor apparatus | 10: Motherboard |
| 30: Semiconductor element unit | 32: First semiconductor element |
| 34: Second semiconductor element | 36: Third semiconductor element |
| 20: Packaging substrate | 22: Core layer |
| 223: Core insulating layer | 21, 21a: Glass substrate |
| 213: First surface | 214: Second surface |
| 23: Core via | 233: First opening part |
| 234: Second opening part | 235: Minimum inner diameter part |
| 24: Core distribution layer | 241: Core distribution pattern |
| 241a: First surface distribution pattern | 241b: Core via distribution pattern |
| 241c: Second surface distribution pattern | 26: Upper layer |
| 25: Upper distribution layer | 251: Upper distribution pattern |
| 252: Blind via | 253: Upper insulating layer |
| 27: Upper surface connecting layer | 271: Upper surface connecting electrode |
| 272: Upper surface connecting pattern | 29: Lower layer |
| 291: Lower distribution layer | 291a: Lower distribution pattern |
| 291b: Lower insulating layer | 292: Lower surface connecting pattern |
| 292a: Lower surface connecting electrode | 292b: Lower surface connecting pattern |
| 50: Connecting part | 51: Element connecting part |
| 52: Board connecting part | 60: Cover layer |
| 21b: Glass defect | 21c: Seed layer, Primer layer |
| 21d: Core distribution layer | 21e: Etched layer of Core distribution layer |
| 23a: Insulating layer | 23b: Etched layer of Insulating layer |
| 23c: Electrically conductive layer | 23d: Etched layer of Electrically conductive layer |
| 23e: Insulating layer | 23f: Etched layer of Insulating layer |
| 23g: Electrically conductive layer | 23h: Etched layer of Electrically conductive layer |

What is claimed is:

1. A packaging substrate comprising:
   a glass substrate comprising a first surface and a second surface facing each other,
   a plurality of core vias passing through the glass substrate in a thickness direction, and
   a core layer having a core seed layer as a seed for forming an electrically conductive layer on a surface of the core vias,
   wherein a thickness ratio of a first thickness and a second thickness of the core seed layer measured at two positions facing each other at an inner diameter surface of the core via is 1:0.4 to 4.5, where the core seed layer is thicker on one side of the via than on a direct opposite side of the via,
   further comprising an upper layer disposed on one surface of the core layer,
   wherein the core layer comprises a core distribution layer disposed on a surface of the glass substrate or a surface of the core via,
   the core distribution layer comprises an electrically conductive layer at least a part of which electrically connect an electrically conductive layer of the first surface and an electrically conductive layer of the second surface through the core via, and
   the core via has an angle of 0.1 to 8 degree or less of an inner surface observed in a cross section of the core via into a thickness direction based on perpendicular to the first face, wherein the inner surface is a surface from an opening part having a larger diameter between an opening part in contact with the first surface and an opening part in contact with the second surface, to a minimum inner diameter part.

2. The packaging substrate of claim 1,
wherein a thickness distribution rate according to equation 1 of the core seed layer is 90% or less;

a thickness distribution rate={(a max thickness of the core seed layer−a min thickness of the core seed layer)/an average thickness of the core seed layer}*100%   [equation 1]

3. The packaging substrate of claim 1,
wherein an average thickness of the core seed layer is 30 to 200 nm.

4. The packaging substrate of claim 1,
wherein the core via comprises a first opening part in contact with the first surface; a second opening part in contact with the second surface; and a minimum inner diameter part having a smallest inner diameter in the entire core via from the first opening part to the second opening part.

5. The packaging substrate of claim 4,
wherein a size of the minimum inner diameter part is 50 to 99%, based on larger one between the diameter of the first surface opening part and the diameter of the second surface opening part.

6. The packaging substrate of claim 4,
wherein the minimum inner diameter part is positioned at a spot corresponding to 40 to 60%, when a total length of the core via is designated as 100%.

7. The packaging substrate of claim 4,
wherein the minimum inner diameter part is positioned at a spot corresponding to less than 40% or more than 60%, when a total length of the core via is designated as 100%.

8. The packaging substrate of claim 1, wherein the packaging substrate is electrically connected to an element unit comprising a semiconductor element.

9. A method of manufacturing a substrate for semiconductor packaging, comprising
preparing a pre-treatment substrate including a glass substrate comprising a first surface and a second surface facing each other and a plurality of core vias passing through the glass substrate in a thickness direction; and forming a core seed layer on an inner diameter surface of the core via by sputtering at a certain angle with respect to a reference line perpendicular to the first surface, wherein the core via has an angle of 8 degrees or less of an inner surface observed in a cross section of the core via into a thickness direction perpendicular to the first surface, wherein the inner surface is a surface from an opening part having a larger diameter between an opening part in contact with the first surface and an opening part in contact with the second surface, to a minimum inner diameter part, and a thickness ratio of a first thickness and a second thickness of the core seed layer measured at two positions facing each other at the inner diameter surface of the core via is 1:0.4 to 4.5, where the core seed layer is thicker on one side of the via than on a direct opposite side of the via, wherein the substrate comprises an upper layer disposed on one surface of the core layer, wherein the core layer comprises a core distribution layer disposed on a surface of the glass substrate or a surface of the core via, the core distribution layer comprises and electrically conductive layer at least a part of which electrically connect an electrically conductive layer of the first surface and an electrically conductive layer of the second surface through the core via, and the core via has an angle of 0.1 to 8 degree or less of an inner surface observed in a cross section of the core via into a thickness direction based on perpendicular to the first face, wherein the inner surface is a surface from an opening part having a larger diameter between an opening part in contact with the first surface and an opening part in contact with the second surface, to a minimum inner diameter part.

* * * * *